United States Patent
Aono

(10) Patent No.: US 8,830,187 B2
(45) Date of Patent: *Sep. 9, 2014

(54) INPUT APPARATUS AND CONTROL METHOD OF INPUT APPARATUS

(75) Inventor: Tomotake Aono, Yokohama (JP)

(73) Assignee: Kyocera Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/001,570

(22) PCT Filed: Jul. 28, 2010

(86) PCT No.: PCT/JP2010/004796
§ 371 (c)(1),
(2), (4) Date: Dec. 27, 2010

(87) PCT Pub. No.: WO2011/013367
PCT Pub. Date: Feb. 3, 2011

(65) Prior Publication Data
US 2011/0169758 A1    Jul. 14, 2011

(30) Foreign Application Priority Data

Jul. 29, 2009 (JP) ................................ 2009-177070

(51) Int. Cl.
G06F 3/041 (2006.01)
H03K 17/96 (2006.01)
G06F 3/01 (2006.01)

(52) U.S. Cl.
CPC .. H03K 17/9625 (2013.01); H03K 2217/96062 (2013.01); G06F 3/0414 (2013.01); G06F 3/016 (2013.01); G06F 3/0416 (2013.01)
USPC ...................... 345/173; 178/18.01; 340/407.1

(58) Field of Classification Search
USPC ......... 345/173–178; 178/18.01–18.09, 18.11; 463/30; 340/4.12, 407.1, 407.2; 715/702
See application file for complete search history.

(56) References Cited

U.S. PATENT DOCUMENTS

| | | | |
|---|---|---|---|
| 4,766,271 A | 8/1988 | Mitsuhashi et al. | |
| 5,977,867 A | 11/1999 | Blouin | |

(Continued)

FOREIGN PATENT DOCUMENTS

| | | |
|---|---|---|
| CN | 1582465 CN | 2/2005 |
| EP | 1 388 874 | 2/2004 |

(Continued)

OTHER PUBLICATIONS

JPO, International Search Report, mailed Mar. 2, 2010 in PCT/JP2009-007079 (corresponds to U.S. Appl. No. 12/979,223).
JPO, Notification of Reasons for Refusal, mailed May 11, 2010 in JP 2008-326316 (corresponds to U.S. Appl. No. 12/979,223).
JPO, Notification of Reasons for Refusal, mailed May 11, 2010 in JP 2008-326297 (corresponds to U.S. Appl. No. 13/001,591).
JPO, Notification of Reasons for Refusal, mailed May 11, 2010 in JP 2009-177070 (corresponds to U.S. Appl. No. 12/979,231).
JPO, Office Action, mailed May 11, 2010 in JP 2009-177079 (corresponds to U.S. Appl. No. 13/001,595).

(Continued)

*Primary Examiner* — Stephen Sherman
(74) *Attorney, Agent, or Firm* — Workman Nydegger

(57) ABSTRACT

An input apparatus has a touch sensor for receiving an input, a load detection unit for detecting a pressure load on a touch face of the touch sensor, a tactile sensation providing unit for vibrating the touch face, and a control unit, when the pressure load detected by the load detection unit satisfies a standard for providing a tactile sensation, for controlling drive of the tactile sensation providing unit to vibrate the touch face at a frequency such that a click sensation is provided to an object (means) pressing the touch face. Thereby, a realistic click sensation similar to that obtained when a push-button switch is operated is provided when an operator operates the touch sensor.

2 Claims, 22 Drawing Sheets

(56) References Cited

U.S. PATENT DOCUMENTS

| | | | |
|---|---|---|---|
| 6,067,081 A | 5/2000 | Hahlganss et al. | |
| 6,118,435 A | 9/2000 | Fujita et al. | |
| 6,337,678 B1* | 1/2002 | Fish | 345/156 |
| 6,822,635 B2 | 11/2004 | Shahoian et al. | |
| 6,937,124 B1* | 8/2005 | Nakamura et al. | 335/222 |
| 7,084,859 B1* | 8/2006 | Pryor | 345/173 |
| 7,119,798 B2* | 10/2006 | Yoshikawa et al. | 345/173 |
| 7,215,329 B2* | 5/2007 | Yoshikawa et al. | 345/173 |
| 7,292,227 B2* | 11/2007 | Fukumoto et al. | 345/173 |
| 7,443,384 B2* | 10/2008 | Harada et al. | 345/173 |
| 7,525,415 B2* | 4/2009 | Yatsu et al. | 340/407.2 |
| 2003/0067449 A1* | 4/2003 | Yoshikawa et al. | 345/173 |
| 2003/0231170 A1* | 12/2003 | Yoshikawa et al. | 345/173 |
| 2004/0061688 A1* | 4/2004 | Nakayama et al. | 345/173 |
| 2004/0178996 A1* | 9/2004 | Kurashima et al. | 345/173 |
| 2005/0219230 A1* | 10/2005 | Nakayama et al. | 345/173 |
| 2006/0119586 A1 | 6/2006 | Grant et al. | |
| 2007/0146334 A1 | 6/2007 | Inokawa | |
| 2008/0042994 A1 | 2/2008 | Gillespie et al. | |
| 2008/0084384 A1 | 4/2008 | Gregorio et al. | |
| 2008/0100177 A1 | 5/2008 | Dai et al. | |
| 2008/0122315 A1 | 5/2008 | Maruyama et al. | |
| 2009/0015555 A1 | 1/2009 | Takashima et al. | |
| 2009/0228791 A1 | 9/2009 | Kim et al. | |
| 2009/0237364 A1 | 9/2009 | Bloomcamp et al. | |
| 2011/0102355 A1 | 5/2011 | Aono et al. | |
| 2011/0102358 A1 | 5/2011 | Aono et al. | |
| 2011/0148795 A1 | 6/2011 | Aono et al. | |
| 2011/0163984 A1 | 7/2011 | Aono et al. | |
| 2011/0260991 A1 | 10/2011 | Aono et al. | |
| 2013/0027324 A1 | 1/2013 | Martin et al. | |

FOREIGN PATENT DOCUMENTS

| | | |
|---|---|---|
| EP | 1 544 720 | 6/2005 |
| EP | 1 967 290 A1 | 9/2008 |
| JP | 08-221173 | 8/1996 |
| JP | 10-293644 | 11/1998 |
| JP | 2003-288158 | 10/2003 |
| JP | 2005-149197 | 6/2005 |
| JP | 2005-258666 | 9/2005 |
| JP | 2005-332063 | 12/2005 |
| JP | 2008-130055 | 6/2008 |
| WO | WO 2006/042309 | 4/2006 |
| WO | 2008/125130 A1 | 10/2008 |
| WO | WO 2008/116547 | 10/2008 |

OTHER PUBLICATIONS

JPO, Office Action, mailed Oct. 4, 2011 in JP 2008-326281.
JPO, Office Action, mailed Oct. 4, 2011 in JP 2008-326311.
U.S. Appl. No. 13/001,553, Oct. 13, 2011, Office Action.
U.S. Appl. No. 12/979,223, May 18, 2011, Office Action.
U.S. Appl. No. 12/979,223, Sep. 26, 2011, Final Office Action.
U.S. Appl. No. 13/001,591, Apr. 22, 2011, Office Action.
U.S. Appl. No. 13/001,591, Aug. 4, 2011, Final Office Action.
U.S. Appl. No. 13/001,591, Oct. 7, 2011, Advisory Action.
U.S. Appl. No. 12/979,231, Apr. 19, 2011, Office Action.
U.S. Appl. No. 12/979,231, Aug. 10, 2011, Final Office Action.
U.S. Appl. No. 12/979,231, Jan. 4, 2012, Notice of Allowance.
U.S. Appl. No. 13/001,595, Sep. 29, 2011, Office Action.
KIPO Office Action, mailed Jul. 9, 2012 in KR 10-2012-7002429.
U.S. Appl. No. 12/979,223, Aug. 13, 2012, Notice of Allowance.
U.S. Appl. No. 13/001,595, Aug. 2, 2012, Office Action.
EPO Office Action dated Feb. 11, 2013 in EP 11 170 994.5.
EPO Office Action dated Feb. 12, 2013 in EP 09 834 407.0.
CN Office Action mailed Nov. 2, 2012 in CN 201080339237.
JPO Office Action mailed Nov. 27, 2012 in JP 2010-288790.
U.S. Appl. No. 13/001,591, Dec. 6, 2012, Final Office Action.
U.S. Appl. No. 13/001,595, Dec. 4, 2012, Final Office Action.
Supplementary European Search Report dated Dec. 17, 2012 in 10804118.7-1233 / 2461233 PCT/JP2010004796.
Supplementary European Search Report dated Dec. 19, 2012 in 10804122.9-2224 / 2461235 PCT/JP2010004800.
KIPO Office Action, mailed Jan. 23, 2013 in KR 10-2011-7014258.
KIPO Office Action, mailed Jan. 23, 2013 in KR 10-2011-7014259.
CN Office Action dated Dec. 21, 2012 in CN 201080033924.1.
Domes incollables SWITCH' AIR™, Nicomatic, Mar. 2006, 3 pgs.
JPO, Office Action mailed Jan. 29, 2013 in JP 2010-288796.
EPO Office Action mailed Feb. 5, 2013 in EP 09 834 408.8.
Laitinen et al., Enabling Mobile Haptic Design: Piezoelectric Actuator Technology Properties in Hand Held Devices, HAVE2006—IEEE International Workshop on Haptic Audio Visual Environments and their Application, IEEE, PI, Jan. 1, 2006, pp. 40-43 XP031041929, ISBN: 978-1-42244-0760-6.
Koskinen et al., Feel-Good Touch: Finding the Most Pleasant Tactile Feedback for a Mobile Touch Screen Button, 10th International Conference on Multimodal Interfaces. ICMI '08—Oct. 20-22, 2008—Chania, Crete, Greece, Jan. 1, 2008 pp. 297-304, XP009138987, ISBN: 978-1-60560-511-1.
Poupyrev et al., Tactile Interfaces for Small Touch Screens, Proceedings of the 16th Annual ACM Symposium on User Interface Software and Technology, Vancouver, Canada, Nov. 2, 2003 [ACM Symposium on User Interface Software and Technology] ACM Press, New York, NY vol. 5, No. 2, Jan. 3, 2003 pp. 217-220, XP002516572, DOI: 10.1145/964696.964721 ISBN: 978-1-58113-636-4.
MacKenzie et al., The Tactile Touchpad, CHI 97 Extended Abstracts on Human Factors in Computing Systems Looking to the Future, Jan. 1, 1997 DOI: 10.1145/1120212.1120408, ISBN: 978-0-89-791926-5, pp. 309-310.
Extended European Search Report mailed Apr. 20, 2012 in 09/34407.0-2224 / 2369448 PCT/JP2009007079.
Extended European Search Report mailed Apr. 20, 2012 in 11170994.5-2224 / 2372497.
Extended European Search Report mailed May 18, 2012 in 09834408.8-1527 / 2369449 PCT/JP2009007080.
JPO, Office Action, mailed Jan. 17, 2012 in JP 2008-326281.
U.S. Appl. No. 13/001,553, Mar. 7, 2012, Final Office Action.
U.S. Appl. No. 12/979,223, Apr. 12, 2012, Office Action.
U.S. Appl. No. 13/001,591, May 21, 2012, Office Action.
U.S. Appl. No. 13/001,595, Mar. 13, 2012, Final Office Action.
CN Office Action dated Jun. 18, 2013 in CN 200980151955.4.
U.S. Appl. No. 13/001,553, Jun. 12, 2013, Office Action.
CN Office Action dated Apr. 24, 2013 in CN 201080033923.7.
CN Office Action dated May 6, 2013 in CN 200980151954.X.
CN Office Action dated Oct. 12, 2013 in CN 201080033923.7.
KIPO Office Action mailed Sep. 27, 2013 in KR 2011-7014258.
EPO Office Action dated Sep. 3, 2013 in EP 09 834 408.8.
U.S. Appl. No. 13/001,553, Sep. 30, 2013, Final Office Action.
U.S. Appl. No. 13/001,591, Sep. 17, 2013, Office Action.
U.S. Appl. No. 13/001,595, Sep. 17, 2013, Office Action.
CN Office Action dated Oct. 17, 2013 in CN 201080033924.1.
CN Office Action dated Feb. 17, 2014 in CN 200980151955.4.
EPO Office Action dated Nov. 6, 2013 in EP 09 834 407.0.
EPO Office Action dated Nov. 6, 2013 in EP 11 170 994.5.
EPO Office Action dated Feb. 17, 2014 in EP 10 804 122.9.
CN Office Action dated Jan. 3, 2014 in CN 200980151954.X.
KIPO Office Action dated Jan. 3, 2014 in KR 2013-7028707.
U.S. Appl. No. 13/001,553, mailed Mar. 13, 2014, Notice of Allowance.
U.S. Appl. No. 13/001,591, mailed Feb. 3, 2014, Final Office Action.
U.S. Appl. No. 13/001,595, mailed Feb. 5, 2014, Final Office Action.
U.S. Appl. No. 13/001,553, mailed Apr. 30, 2014, Notice of Allowance.
20130027324, published Jan. 31, 2013, Martin et al.
CN Office Action dated May 30, 2014 in CN 201080033923.7 with concise explanation.

* cited by examiner

FIG. 6
(a)
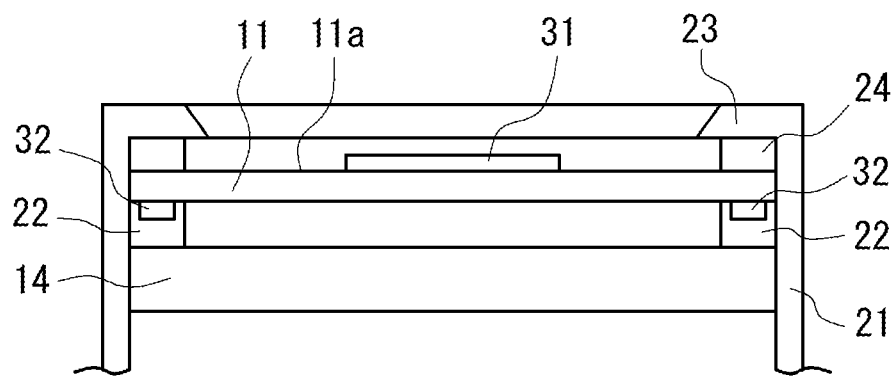
(b)
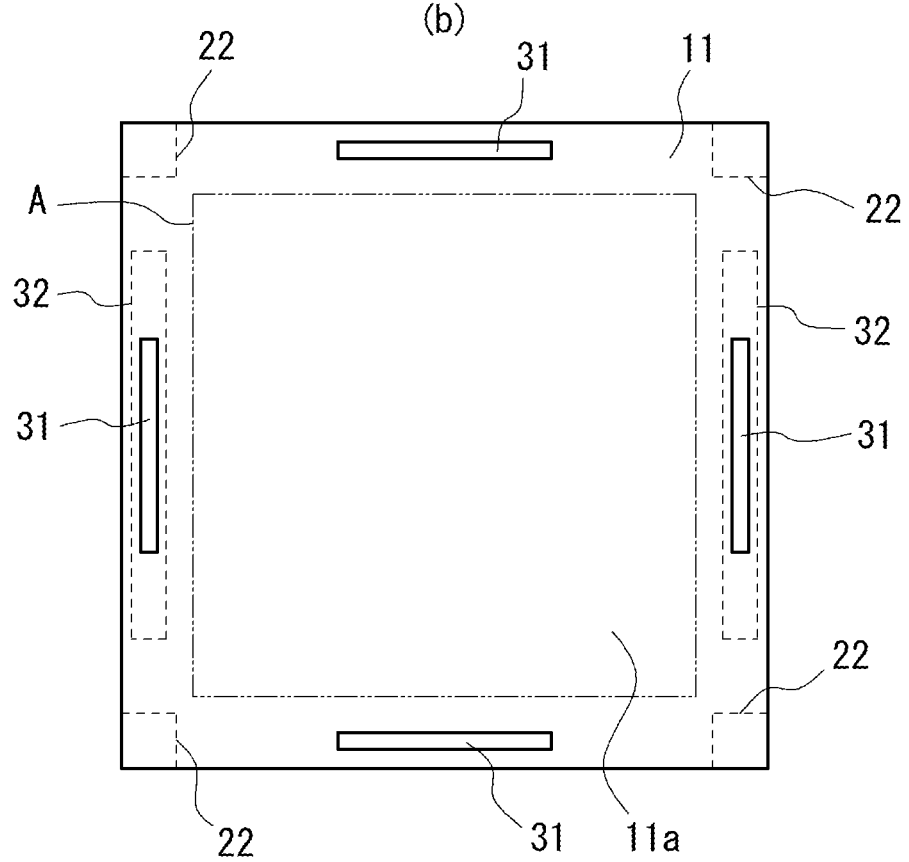

INPUT APPARATUS AND CONTROL METHOD OF INPUT APPARATUS

CROSS REFERENCE TO RELATED APPLICATION

This application claims priority to and the benefit of Japanese Patent Application No. 2009-177070 filed on Jul. 29, 2009, the entire contents of which are incorporated herein by reference.

TECHNICAL FIELD

The present invention relates to input apparatuses having touch sensors and control methods of input apparatuses.

BACKGROUND ART

In recent years, input apparatuses having touch sensors such as touch panels, touch switches or the like are popularly used as input apparatuses such as operation units, switches and the like for receiving input operations by a user in mobile terminals such as mobile phones, information equipments such as calculator, ticket vending machines, home electric appliances such as microwaves, TV sets, lighting equipments, industrial equipments (FA equipments) and the like.

There are known a variety of types of those touch sensors, such as a resistive film type, a capacitive type, an optical type and the like. However, touch sensors of any of these types receive a touch input by a finger or a stylus pen and, unlike push-button switches, the touch sensors themselves are not physically displaced even when being touched.

Since the touch sensors themselves are not physically displaced when touched, an operator cannot obtain feedback to an input even though the touch input is received. As a result, the operator is likely to input erroneously by touching the same spot multiple times, which may be stressful for the operator.

As methods to prevent such erroneous inputs, there are known methods of visually or auditory confirming the input operations by, for example, generating sounds or by changing a display state, such as colors of input objects such as input buttons and the like graphically depicted in a display unit, according to a pushed area upon reception of the touch input.

However, such auditory feedback may be difficult to be confirmed in a noisy environment and is not applicable when the equipment being used is in a silent mode. In addition, in using such visual feedback, if the input object displayed on the display unit is small, the operator may not be able to confirm the change in the display state, as a view of the input object is blocked by a finger, particularly when the operator is inputting by the finger.

There is also suggested a feedback method relying on neither the auditory- nor visual sensation but instead generating a tactile sensation at operator's fingertip by vibrating the touch sensor when the touch sensor receives an input (for example, see Patent Documents 1, 2).

RELATED ART DOCUMENTS

Patent Documents

Patent Document 1: Japanese Patent Laid-Open No. 2003-288158
Patent Document 2: Japanese Patent Laid-Open No. 2008-130055

SUMMARY OF INVENTION

Technical Problem

The techniques disclosed in the above Patent Documents 1 and 2, however, merely generate the tactile sensation at the operator's fingertip by vibration. That is, they provide a mere "throbbing" sensation at the operator's fingertip touching a touch face by vibrating the touch sensor.

These apparatuses have button switches such as, for example, push-button switches (push-type button switches) graphically depicted on the touch sensor and provide the "throbbing" sensation, although the operator operates (pushes) the push-button switches (push-type button switches) intending to push.

Therefore, although the operator pushes (operate with the intention of pushing) the push-type button switches, the operator will not be able to feel a realistic click sensation as "Click", which is obtained when the push-type button switches are pushed, and thus has a feeling of strangeness.

As a result, especially if the button switches such as the push-button switches (plush-type button switches) are graphically depicted on the touch sensor and a threshold for receiving an input to the touch sensor is low, a tactile sensation is provided when a finger and the like lightly touches the touch sensor. Thereby, it may cause erroneous operations in response to an unintended action (touch) before the operator pushes or it may inflict the feeling of strangeness on the operator upon the untended action (touch) before the operator pushes. Here, the threshold for the touch sensor to receive an touch input is a threshold at which the touch sensor responds, which is a threshold of a pressure at which an upper conductive film is contacted to a lower conductive film for the touch sensor of the resistive film type and a threshold for detection of an electric signal by contact for the touch sensor of the capacitive type.

Accordingly, an object of the present invention in consideration of such conditions is to provide an input apparatus capable of providing the realistic click sensation, similar to that obtained when the push-button switch is operated, when an operator operates the touch sensor, and a control method of the input apparatus.

Solution to Problem

In order to achieve the above object, an input apparatus according to a first aspect of the present invention includes:
a touch sensor for receiving an input;
a load detection unit for detecting a pressure load on a touch face of the touch sensor;
a tactile sensation providing unit for vibrating the touch face; and
a control unit for controlling drive of the tactile sensation providing unit to vibrate the touch face at a frequency such that a click sensation is provided to an object pressing the touch face, when the pressure load detected by the load detection unit satisfies a standard for providing a tactile sensation.

In addition, in order to achieve the above object, a control method of an input apparatus according to a second aspect of the present invention is a control method of an input apparatus including a touch sensor for receiving an input, a load detection unit for detecting a pressure load on a touch face of the touch sensor, and a tactile sensation providing unit for vibrating the touch face, and includes the step of
controlling drive of the tactile sensation providing unit to vibrate the touch face at a frequency such that a click sensation is provided to an object pressing the touch face, when the pressure load detected by the load detection unit satisfies a standard for providing a tactile sensation.

Moreover, in order to achieve the above object, an input apparatus according to a third aspect of the present invention includes:

a touch sensor for receiving an input;

a load detection unit for detecting a pressure load on a touch face of the touch sensor;

a tactile sensation providing unit for vibrating the touch face; and a control unit for driving the tactile sensation providing unit with a single drive signal when the pressure load detected by the load detection unit satisfies a standard for providing a tactile sensation, wherein the drive signal has a frequency of 140 Hz or higher, and the drive signal is used for a period determined in a range from 1/4 period to 5/4 period of the drive signal.

Furthermore, in order to achieve the above object, a control method of an input apparatus according to a fourth aspect of the present invention is a control method of an input apparatus including a touch sensor for receiving an input, a load detection unit for detecting a pressure load on a touch face of the touch sensor, and a tactile sensation providing unit for vibrating the touch face, and includes the step of:

driving the tactile sensation providing unit with a single drive signal when the pressure load detected by the load detection unit satisfies a standard for providing a tactile sensation, wherein the drive signal has a frequency of 140 Hz or higher, and the drive signal is used for a period determined in a range from 1/4 period to 5/4 period of the drive signal.

Effect of the Invention

According to the present invention, if the pressure load on the touch sensor satisfies the standard for providing the tactile sensation, the touch face of the touch sensor vibrates at a frequency such that a realistic click sensation, similar to that obtained when a push-button switch is operated, is provided to an operator.

BRIEF DESCRIPTION OF DRAWINGS

FIG. 6 shows an exemplary housing structure of the input apparatus shown in FIG. 5;

DESCRIPTION OF EMBODIMENTS

Prior to descriptions of embodiments of the present invention, a description of a principle of a method to provide a click sensation applied to an input apparatus according to the present invention is provided.

The principle of the method to provide the click sensation described below was found out by a joint research by members including inventors of the present invention. An applicant of the present invention has already suggested an input apparatus based on the principle (for example, see Japanese Patent Application No. 2008-326281).

For tactile sensory awareness, a human has a nerve responsible for a pressure sensation to feel a tactile sensation, such as hardness or softness of an object, from a load introduced to a bone and a muscle when touching the object and another nerve responsible for a tactile sensation to feel a texture of the object and the like by detecting a vibration introduced to a skin surface when touching the object. That is, the pressure sensation detects the load, whereas the tactile sensation detects the vibration. In addition, a tactile sensation is generally a combination of the pressure sensation and the tactile sensation. Accordingly, reproduction of a stimulus, similar to the stimulus to the "pressure sensation" and the "tactile sensation" when operating a push-button switch, on a touch face of a touch sensor enables to provide a click sensation to an operator.

On the other hand, metal dome switches, emboss switches, rubber switches, tactile switches and the like, for example, are widely known as the push-button switches used for information equipments and home electric appliances. Although there are differences in the stroke of a push-button and the applied load (pressing force) according to types of the switches, those general push-button switches basically have load characteristics as shown in FIG. 1.

Figure 1:
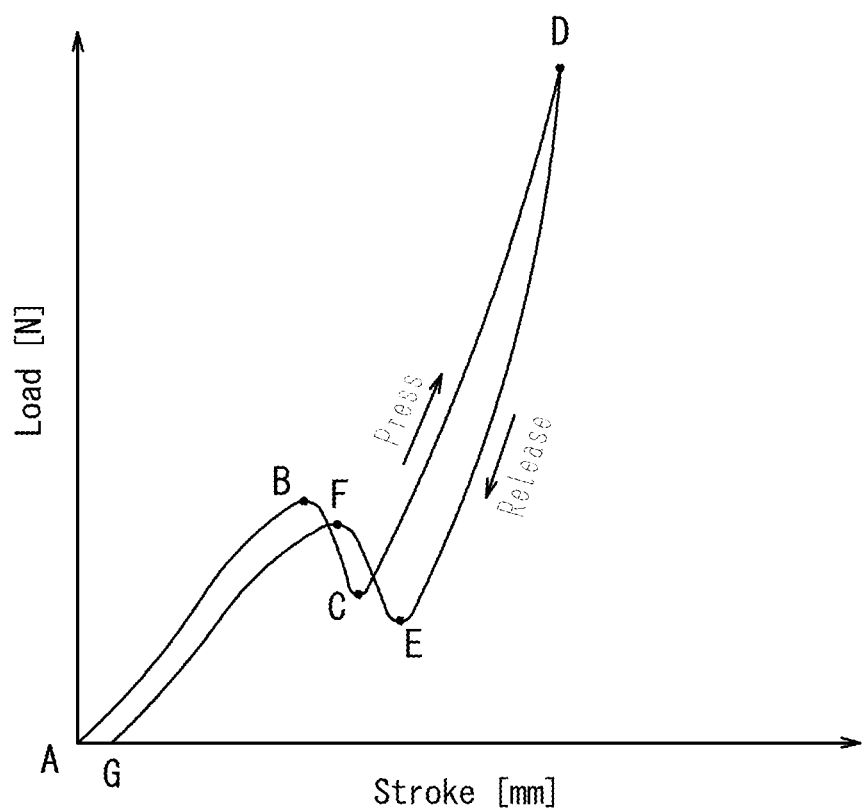
FIG. 1 is a diagram illustrating a general load characteristic of a push-button switch.

In the load characteristics in pressing in FIG. 1, a period from a point A to a point B represents a period in which a load increases in substantially proportion to pressing down from a start of pressing the push button. A period from the point B to a point C represents a period in which a convex elastic member such as the metal dome is buckled since the push button is pressed down, and thus the load is rapidly decreased. A period from the point C to a point D represents a period in which a contact point of the switch closes and the load increases in substantially proportion to pressing down.

Although there is a hysteresis to some degrees, the load characteristics of the push button in releasing retrace a change of the load in pressing. That is, a period from the point D to a point E represents a period in which the load decreases in substantially promotion to release from a start thereof and the contact point of the switch maintains a closed state. A period from the point E to a point F represents a period in which the elastic member recovers in a convex form from a buckled form by release of the push button and the load rapidly increases, and at start of this period the contact point of the switch is open. A period from the point F to a point G represents a period in which a finger is released from the push button after recovery of the elastic member and the load decreases in substantially proportion to the release.

In the load characteristics shown in FIG. 1, a maximum stroke of the push button is minimal; equal to or less than 1 mm for the metal dome switch, the emboss switch and the tactile switch and equal to or less than 3 mm for the rubber switch, for example. In addition, loads at the point B are around 1 N to 6 N, for example, on the metal dome switch, the emboss switch and the tactile switch and around 0.5 N, for example, on the rubber switch. The operator can feel the click sensation when operating any of those push-button switches.

As such, the researchers studied what kind of movement of the push-button switch provides the click sensation created by the "pressure sensation" and the "tactile sensation". First, it is studied which causes the click sensation, change in the stroke or change in the pressure load.

Figure 2:
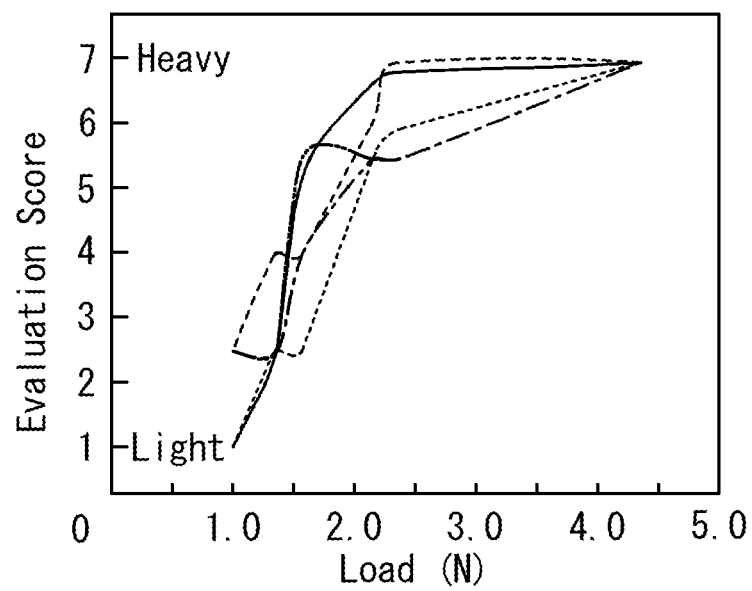
FIG. 2 is a diagram illustrating results of sensory evaluations on operations of a variety of push-button switches with different pressure loads.

FIG. 2 is a diagram illustrating results of sensory evaluations on how the operator felt when operating a variety of push-button switches with different pressure loads. A horizontal axis represents an actual pressure load and a vertical axis represents how operators felt about the push-button switches, heavy or light, on a scale of 1 to 7. Subjects as the operators were five people who were accustomed to use of mobile terminals. As can be seen in FIG. 2, it is shown that they could percept that push-button switches with high pressure loads were heavy and push-button switches with low pressure loads were light.

Figure 3:
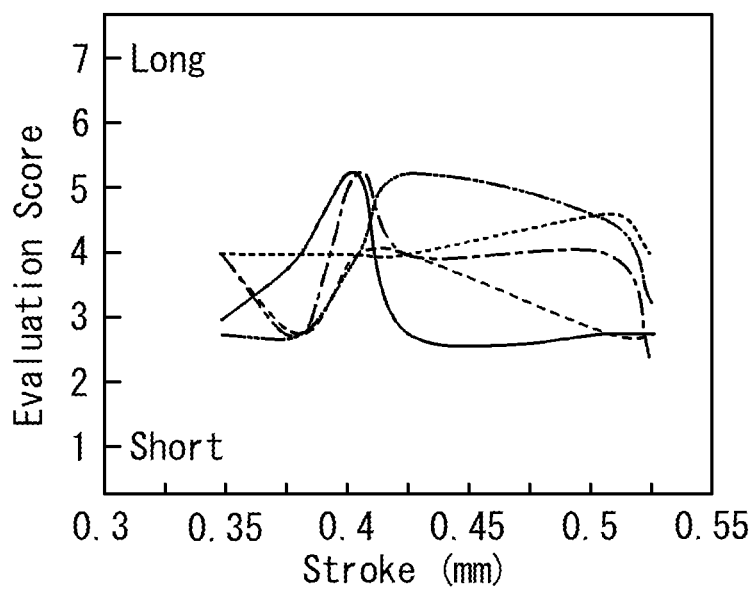
FIG. 3 is a diagram illustrating results of sensory evaluations on operations of a variety of push-button switches with different strokes.

FIG. 3 is a diagram illustrating results of sensory evaluations on how the operators felt when operating a variety of push-button switches with different strokes. A horizontal axis represents actual strokes and a vertical axis represents how the operators felt about the push-button switches, long or short, on a scale of 1 to 7. Subjects as the operators were the same five people as those in FIG. 2, who were accustomed to use of mobile terminals. As can be seen in FIG. 3, they could not clearly percept whether a minimal stroke was long or short.

The results of sensory evaluations presented above shows that the human can percept a difference in the load but not a difference in the minimal stroke.

Therefore, the researchers focused on a change in the pressure load. That is, since the human cannot percept the difference in the stroke, it was studied whether the human can feel the click sensation if the pressure load on a plane such as the touch sensor, that is, a stimulus to the pressure sensation is changed following the points A, B and C in FIG. 1. Therefore, an experimental apparatus having a plate displacable in a vertical direction was prepared. Then, the plate was pressed down from the point A to the point B as shown in FIG. 1 and, at a point when a load reached the load at the point B, the plate was instantaneously displaced downward slightly in order to reproduce the change in the load between the points B, C.

As a result, although a "sense of pressing" to "have pressed down" the push-button switch was obtained, the realistic click sensation such as "Click" which could be obtained when operating the metal dome switch, for example, was not obtained. That is, it was found out that there is another element, which cannot be cleared by a relationship between the stroke and the load, in order to obtain the realistic click sensation.

As such, the researchers next studied focusing not only on the "pressure sensation" but also the "tactile sensation", which is another sensibility. Accordingly, with a variety of mobile terminals having the input apparatus with the push-button switches of the metal dome switches mounted thereon, the researchers measured vibrations generated at push buttons when the push buttons were operated. As a result, it was found out that at a point when the pressure load reaches the point B in FIG. 1, that is, at a point when the metal dome starts being buckled, the push button vibrates at a frequency of approximately 100-200 Hz.

Figure 4:
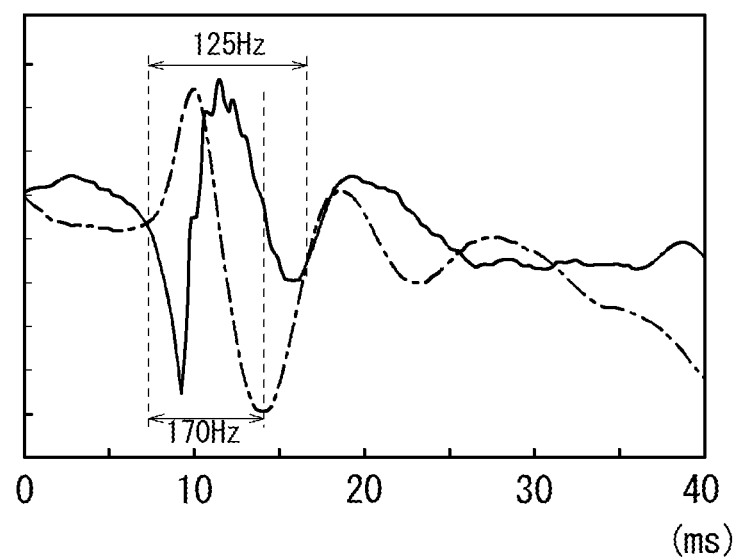
FIG. 4 is a diagram illustrating an exemplary result of a measurement of a vibration generated at a push button upon operation of the push-button switch.

FIG. 4 is a diagram illustrating an exemplary result of such measurement. A horizontal axis represents a pressure elapsed time, whereas a vertical axis represents vibration amplitude. This push-button switch vibrates as shown by a solid line in FIG. 4 at the point B in FIG. 1. Thereby, it was found out that the human receives 1 period of vibration stimulus of about 6 ms (a frequency of approximately 170 Hz) when pressing this push-button switch. In addition, at a point when the pressure load on the push-button switch reached the point F in FIG. 1 in releasing, that is, at a point when the metal dome recovered from the buckled state, this push button vibrated as shown by the dashed line in FIG. 4. Thereby, it was found out that in case of this push-button switch the human receives 1 period of the vibration stimulus of about 8 ms (a frequency of approximately 125 Hz) at release.

Accordingly, when the touch face in the form of a plate such as the touch sensor is pressed down, it is possible to provide the click sensation, similar to that obtained when operating the push-button switch having the result of measurement as shown in FIG. 4, to the operator if the input apparatus stimulates the pressure sensation by letting the operator voluntarily press down the touch face without vibration when the load is from the point A to the point B shown in FIG. 1 and, at the point B, stimulates the tactile sensation by vibrating the touch face for 1 period at the frequency of 170 Hz or if the input apparatus stimulates the tactile sensation by providing a vibration waveform actually measured from the push-button switch to the operator.

Based on the above principle, when the touch face is pressed, the input apparatus according to the above suggestion by the applicant stimulates the pressure sensation until the pressure load satisfies a predetermined standard for receiving an input and, when the standard is satisfied, stimulates the tactile sensation by vibrating the touch face with a predetermined drive signal, that is, with a frequency, period which means drive time (wavelength), waveform and vibration amplitude, by the vibration unit. Thereby, the realistic click sensation similar to that obtained when the push-button switch is operated is provided to the operator.

Embodiments of the present invention based on the aforementioned principle will be described with reference to the accompanying drawings.

The present invention provides the realistic sensation, similar to that obtained when the push-button switch is pushed down, to the operator of the touch sensor by detecting the pressure load separately from an operation of the touch sensor to receive an input and vibrating the touch sensor at a certain frequency. That is, when the touch sensor is operated, the pressure load is detected separately from the operation of the touch sensor to receive an input and, if the pressure load on the touch face of the touch sensor satisfies a standard pressure load for providing the tactile sensation, the touch face is vibrated at the certain frequency such that the realistic click sensation is provided to the operator without a feeling of strangeness.

(First Embodiment)

Figure 5:
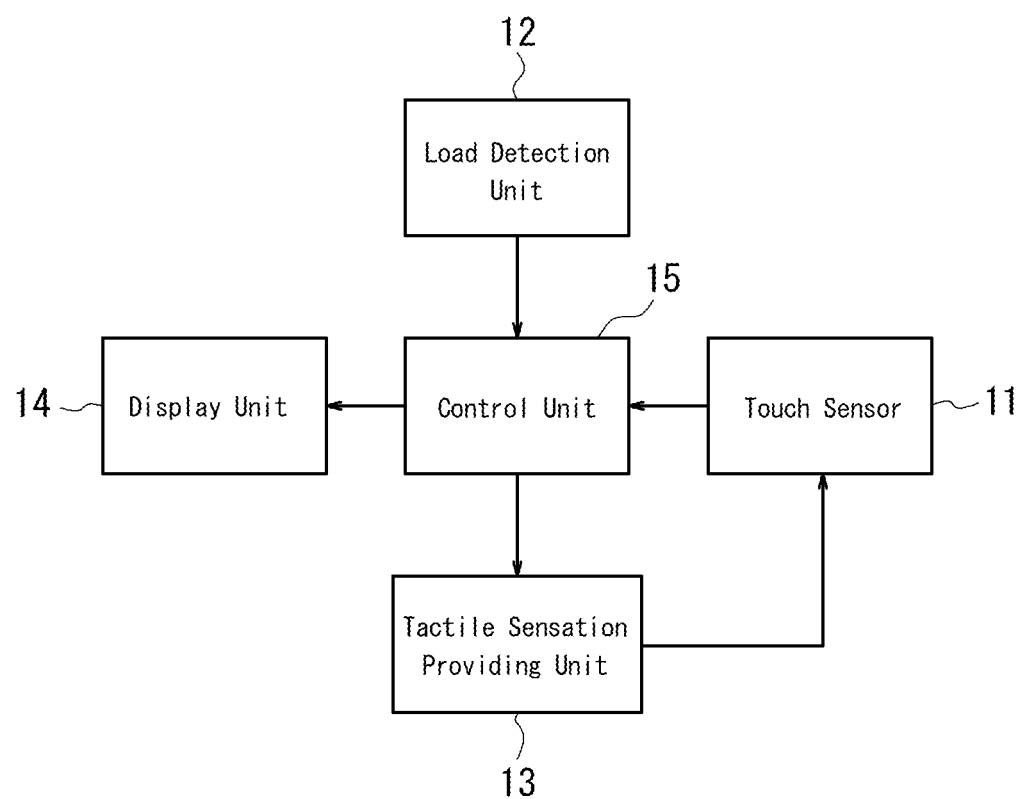
FIG. 5 is a block diagram illustrating a schematic constitution of an input apparatus according to a first embodiment of the present invention.

FIG. 5 is a block diagram illustrating a schematic constitution of an input apparatus according to a first embodiment of the present invention. This input apparatus has a touch sensor 11, a load detection unit 12, a tactile sensation providing unit 13, a display unit 14, and a control unit 15 for controlling overall operations. The touch sensor 11 receives an input to the display unit 14 by a finger and the like and may be, for example, of a known type such as a resistive film type, a capacitive type, an optical type and the like. The load detection unit 12 detects the pressure load applied to the touch face of the touch sensor 11 and may include an element such as, for example, a strain gauge sensor, a piezoelectric element or the like, which linearly reacts to a load. The tactile sensation providing unit 13 vibrates the touch face of the touch sensor 11 at a frequency and may include, for example, a piezoelectric vibrator. The display unit 14 displays an input object of an input button or the like such as the push-button switch (plush-type button switch) and may be constituted of, for example, a liquid crystal display panel, an organic EL display panel or the like.

FIG. 6 shows an exemplary housing structure of the input apparatus shown in FIG. 5; FIG. 6(a) is a cross-sectional view of a main section and FIG. 6(b) is a plane view of the main section. The display unit 14 is contained in a housing 21. The touch sensor 11 is disposed on the display unit 14 via insulators 22 made of elastic members. In the input apparatus according to the present embodiment, the display unit 14 and the touch sensor 11 are rectangular in shape in a planar view and the touch sensor 11 is disposed on the display unit 14 via the insulators 22 arranged at four corners outside a display area A of the display unit 14 shown by a chain double-dashed line in FIG. 6(b).

In addition, the housing 21 is provided with an upper cover 23 covering a surface area of the touch sensor 11 outside the display area of the display unit 14. Insulator 24 made of elastic member is arranged between the upper cover 23 and the touch sensor 11.

The touch sensor 11 shown in FIG. 6 may have, for example, a surface member having a touch face 11a constituted of a transparent film or a glass and a rear face member constituted of the glass or acryl. The touch sensor 11 may be designed such that, when the touch face 11a is pressed down, a pushed part or a structure itself is bent (strained) slightly in accordance with the pressing force.

A strain gauge sensor 31 for detecting a load (pressuring force) applied on the touch sensor 11 is provided, adhered or the like, on a surface of the touch sensor 11 at a position close to each periphery covered by the upper cover 23. In addition, a piezoelectric vibrator 32 for vibrating the touch sensor 11 is provided, adhered or the like, on the rear face of the touch sensor 11 at a position close to a periphery on each of two opposing sides. That is, the input apparatus shown in FIG. 6 has the load detection unit 12 shown in FIG. 5 including four strain gauge sensors 31 and the tactile sensation providing unit 13 including two piezoelectric vibrators 32. In addition, the tactile sensation providing unit 13 vibrates the touch sensor 11 to vibrate the touch face 11a. It is to be noted that the housing 21, the upper cover 23 and the insulator 24 shown in FIG. 6(a) are omitted in FIG. 6(b).

Figure 7:
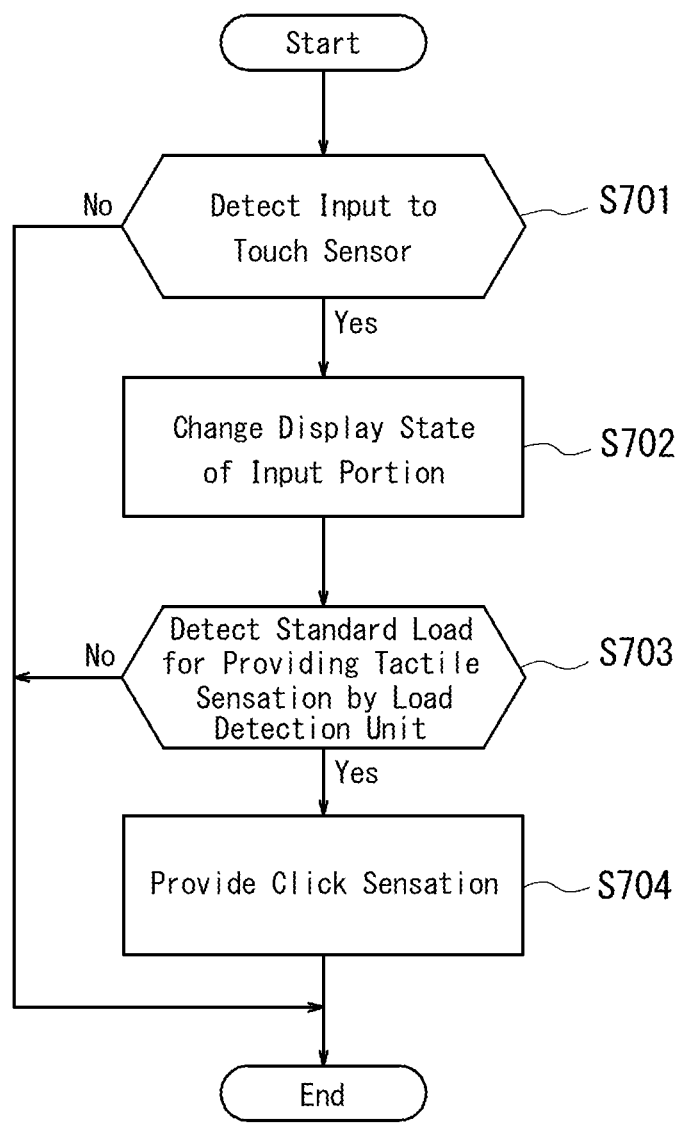
FIG. 7 is a flowchart of operations by the input apparatus shown in FIG. 5.

FIG. 7 is a flowchart of operations by the input apparatus according to the present embodiment. The control unit 15 monitors an input to the touch sensor 11 as well as monitoring a load detected by the load detection unit 12. The control unit 15 then detects whether the input to the touch sensor 11 by a pressing object (pressing means) such as a finger, a stylus pen and the like is an input to the input object displayed on the display unit 14 (step S701). As a result, if detecting that it is the input to the input object, the control unit 15 changes a display state of a portion (input portion) on the display unit 14 contacted by the pressing object (pressing means), by varying color or the like (step S702).

In addition, the control unit 15 also detects whether the pressure load detected by the load detection unit 12 increases with the pressure on the touch sensor 11 and satisfies the standard pressure load for providing the tactile sensation (step S703). If detecting that the pressure load satisfies the standard pressure load as a result, the control unit 15 drives the tactile sensation providing unit 13 with a predetermined drive signal. Thereby, the touch sensor 11 is vibrated in a predetermined vibration pattern in order to provide the click sensation (step S704). It is to be noted that the load detection unit 12 detects the load from, for example, an average output value of the four strain gauge sensors 31. In addition, the tactile sensation providing unit 13 drives, for example, two piezoelectric vibrators 32 in phase.

Here, the standard pressure load for providing the tactile sensation detected at step S703 is, for example, the load at the point B shown in FIG. 1. Accordingly, the standard pressure load may be appropriately set in accordance with the load characteristic of an intended push-button switch in pressing. For example, a standard load pressure may be set to be equal to a load at which the touch sensor 11 responds (setting a timing to provide the tactile sensation to be the same as a timing of response by the touch sensor 11) or to be higher than the load at which the touch sensor 11 responds (setting the timing to provide the tactile sensation later than the timing of response by the touch sensor 11). Especially if it is applied to a mobile terminal, the standard pressure load may be set by a user as desired such that, in the load at which the touch sensor 11 responds or higher (the setting of the timing to provide the tactile sensation later than the timing of the response of the touch sensor 11), elder user may set it heavier (slower), whereas a user who often writes messages may set it lighter (quicker). Thereby, the click sensation is provided to the operator via the pressing object (pressing means) pressing the touch face 11a of the touch sensor 11, so that the operator can recognize that an input operation is completed.

In addition, the predetermined drive signal for driving the tactile sensation providing unit 13 at step S704, that is, the certain frequency, the period (wavelength), the waveform and the vibration amplitude to stimulate the tactile sensation may be set appropriately according to the click sensation to be provided. For example, in order to provide the click sensation represented by the metal dome switch used for the mobile terminals, at the above point when the standard pressure load is applied, the tactile sensation providing unit 13 is driven by a drive signal, for example a sine wave with a frequency of 170 Hz, for 1 period so as to vibrate the touch face 11a by approximately 15 μm in a state of the standard pressure load being applied thereon. Thereby, it is possible to provide the realistic click sensation to the operator.

As set forth above, the input apparatus according to the present embodiment stimulates the pressure sensation until the load applied to the touch sensor 11 detected by the load detection unit 12 satisfies the standard for providing the tactile sensation and, when the standard is satisfied, stimulates the tactile sensation by driving the tactile sensation providing unit 13 with the predetermined drive signal such that the touch face 11a is vibrated in a predetermined vibration pattern. Thereby, the input apparatus provides the click sensation to the operator such that the operator recognizes that the input operation is completed. Accordingly, even if the button switch such as the push-button switch (push-type button switch) is graphically depicted on the touch sensor, the operator can perform the input operation with feeling the realistic click sensation similar to that obtained when operating the push-button switch, thus the operator may not have the feeling of strangeness. Moreover, since the operator can perform the input operation in conjunction with perception to "have tapped" the touch sensor 11, it prevents erroneous input caused by mere tapping.

In addition, if the standard pressure load for providing the tactile sensation is set higher than the load at which the touch sensor 11 responds (setting the timing to provide the tactile sensation later than the timing of the response by the touch sensor 11), an input position is determined according to a touch operation to the touch face 11a, and the display state of the input object at a corresponding portion of the display unit 14 is changed. Then, when the pressure load on the touch face 11a detected by the load detection unit 12 satisfies the standard for providing the tactile sensation, the tactile sensation providing unit 13 is driven to provide the click sensation and the input position is confirmed to enable an execution of predetermined processing. In this case, the operator can confirm that the input object is selected, by seeing a change of the display state of the input object displayed on the display unit 14. Moreover, with the click sensation provided to the operator upon pressing the touch face 11a, the operator can recognize that the input object selected is determined. Thereby, it prevents erroneous input by a so-called wandering finger.

(Second Embodiment)

Figure 8:
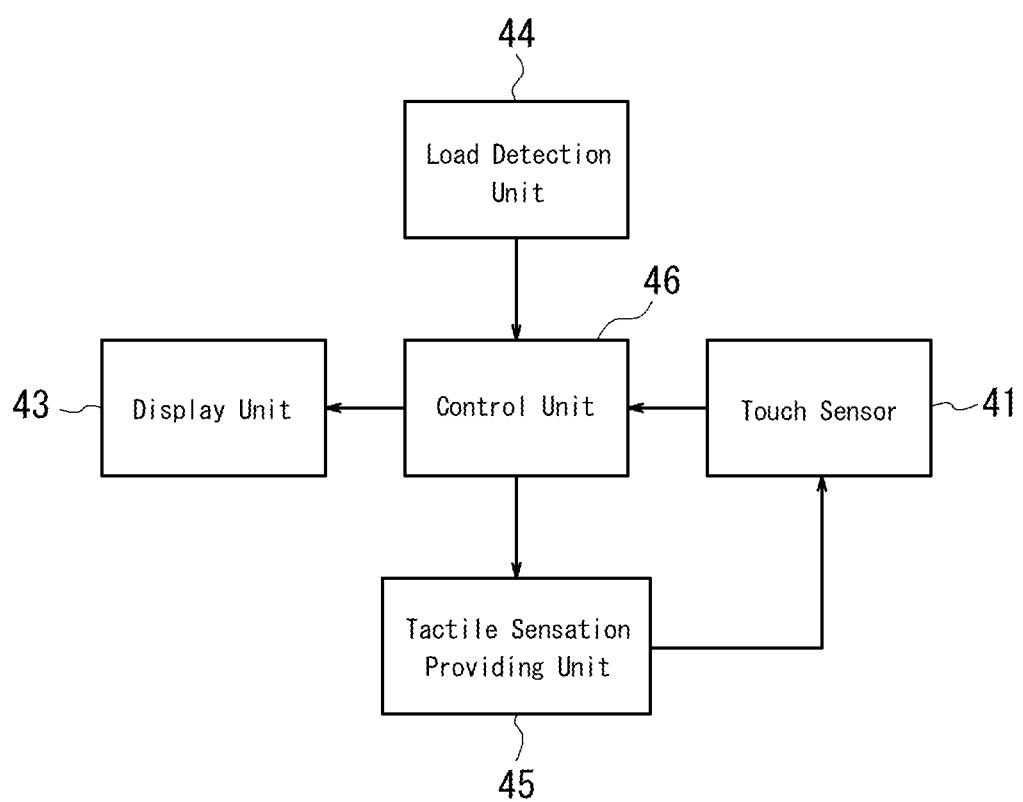
FIG. 8 is a block diagram illustrating a schematic constitution of an input apparatus according to a second embodiment of the present invention.
Figure 9:
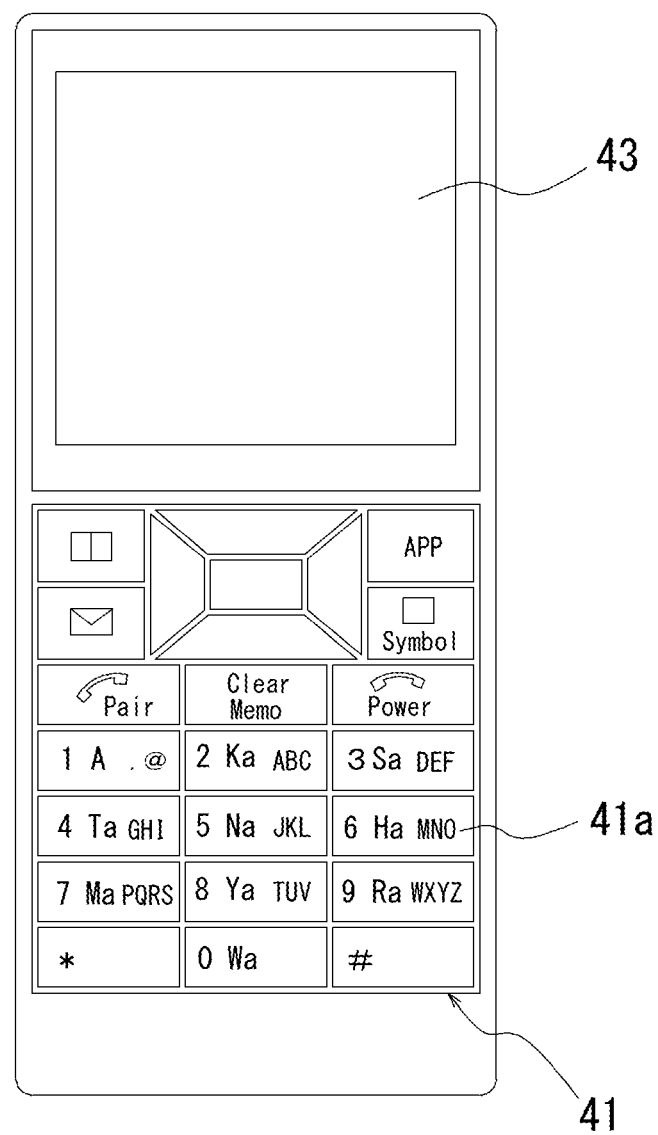
FIG. 9 is a front view of the input apparatus shown in FIG. 8.

FIG. 8 and FIG. 9 illustrate an input apparatus according to a second embodiment of the present invention; FIG. 8 is a block diagram of a schematic constitution and FIG. 9 is a front view. This input apparatus is mounted on, for example, the mobile terminal and, as shown in FIG. 8, has a touch sensor 41 for receiving an input, a display unit 43 for displaying information based on an input position on the touch sensor 41, a load detection unit 44 for detecting a pressure load on the touch sensor 41, a tactile sensation providing unit 45 for vibrating the touch sensor 41 and a control unit 46 for controlling overall operations.

As shown in FIG. 9, a plurality of input objects 41a such as numeric keys are already provided, printed, adhered or the like, on the touch sensor 41. Accordingly, in the input apparatus according to the present embodiment, each of the input objects 41a constitutes the touch face. In order to prevent an erroneous input pressing a plurality of adjacent input objects 41a, an effective pressing area of each input object 41a for receiving an input is set to be smaller than a disposition area of the input object 41a. It is to be noted that, in FIG. 8, the load detection unit 44 and the tactile sensation providing unit 45 have strain gauge sensors and piezoelectric vibrators, respectively, in the same manner as those of the input apparatus shown in FIG. 6.

The control unit 46 monitors an input to the touch sensor 41 and a load detected by the load detection unit 44. When a pressure load detected by the load detection unit 44 increases with the pressure on the touch sensor 41 and satisfies the standard for providing the tactile sensation, the control unit 46 drives the tactile sensation providing unit 45 with a predetermined drive signal to vibrate the touch sensor 41 in the predetermined vibration pattern in order to vibrate the touch face 11a.

That is, separately from a detection of an input to the effective pressing area of the input object by the touch sensor 41, the control unit 46 detects the pressure load and, in the same manner as that according to the first embodiment, drives the tactile sensation providing unit 45 with the drive signal, for example a sine wave with a constant frequency of 170 Hz, for 1 period at a point when the load on the touch sensor 41 increases and satisfies the standard for providing the tactile sensation, such that the touch sensor 41 is vibrated by about 15 μm in a state of the predetermined load being applied thereon. Thereby, the click sensation is provided to the operator. In addition, by receiving the input detected on the touch sensor 41, the control unit 46 displays according to the input on the display panel 43.

Hence, if the standard pressure load for providing the tactile sensation is set to a load at which the touch sensor 41 responds or higher, the operator, in the same manner as the first embodiment, can perform the input operation to the touch sensor 41 with feeling the realistic click sensation similar to that obtained when operating the push-button switch, thus the operator does not have the feeling of strangeness. Moreover, since the operator performs the input operation in conjunction with the perception to "have tapped" the touch sensor 41, it prevents the erroneous input caused by mere tapping.

Here, results of sensory evaluations on the click sensation conducted by the researchers stated above are described together with the research on the principle of the click sensation providing method described above. The sensory evaluations described below were conducted using the input apparatus previously suggested by the applicant described above.

Although there are deviations to some degrees according to models of terminals, the metal dome switches widely used for commercially available mobile terminals have the load characteristics that the load is rapidly decreased when a predetermined load, roughly equal to or less than 6 N and generally equal to or less than 3 N, is applied thereon. As such, the researchers conducted the sensory evaluations of the click sensation with a load of 1.5 N (load at the point B in FIG. 1) on the touch sensor for starting drive of a vibration unit (corresponding to the tactile sensation providing unit according to the present invention) and parameters such as the frequency, the period (wavelength) and the waveform of the drive signal.

Exemplary results of the evaluations are shown in FIG. 10 to FIG. 13. In FIG. 10 to FIG. 13, the subjects were the same five people as those involved in the sensory evaluations shown in FIG. 2 and FIG. 3. Three evaluation items were "feel click sensation", "good feeling" and tactile sensation "similar to mobile terminal". For the item "feel click sensation", "No" scores 1 and "Strongly feel" scores 7. For the item "good feeling", "Bad" scores 1 and "Good" scores 7. For the item "similar to mobile terminal", "not similar" scores 1 and "very similar" scores 7. The score of each item represents an average score of the five people.

Figure 10:
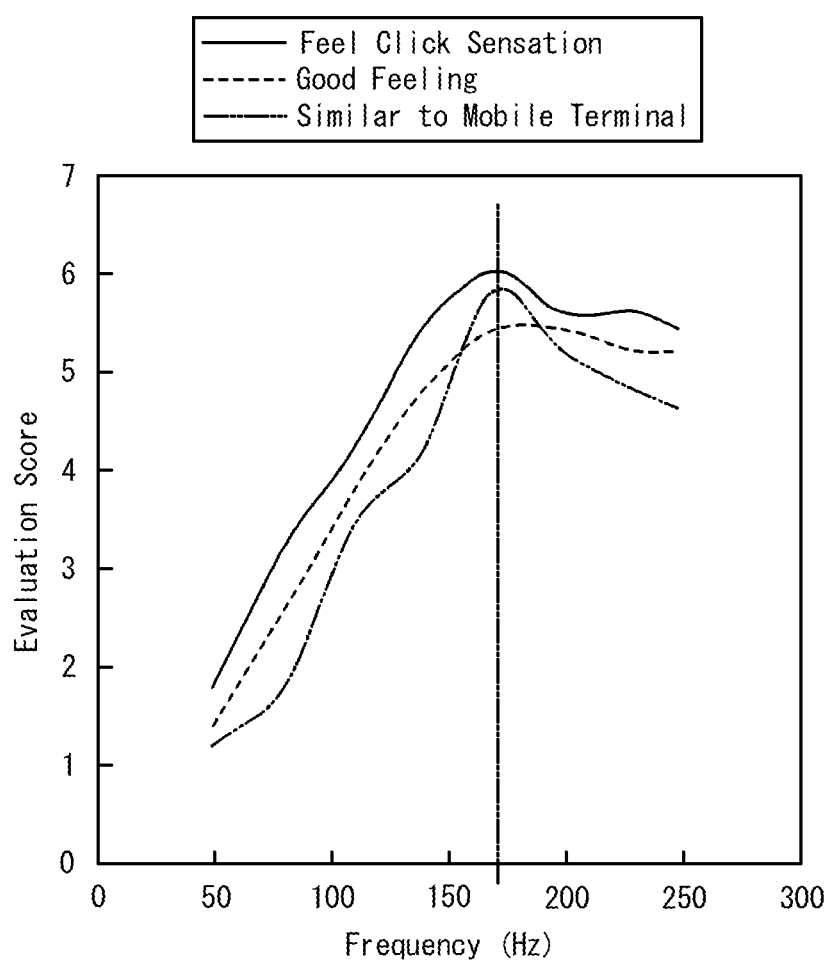
FIG. 10 is a diagram illustrating results of sensory evaluations on a click sensation when varying frequency for vibrating a touch sensor.

FIG. 10 shows results of evaluations when varying the frequency. In sensory evaluations with them, the period (wavelength) to drive the vibration unit, that is, the drive time was 1 period, the waveform was the sine wave and the frequency was varied in a range of 50-250 Hz. The amplitude of the drive signal was set to a level at which the vibration amplitude of 15 μm can be obtained in a state of a predetermined standard load being applied on the touch sensor. As can be seen in FIG. 10, it was confirmed that, although the highest evaluation was obtained at the frequency of 170 Hz, the human can obtain the click sensation similar to that of the mobile terminals at a frequency of 140 Hz or higher.

Figure 11:
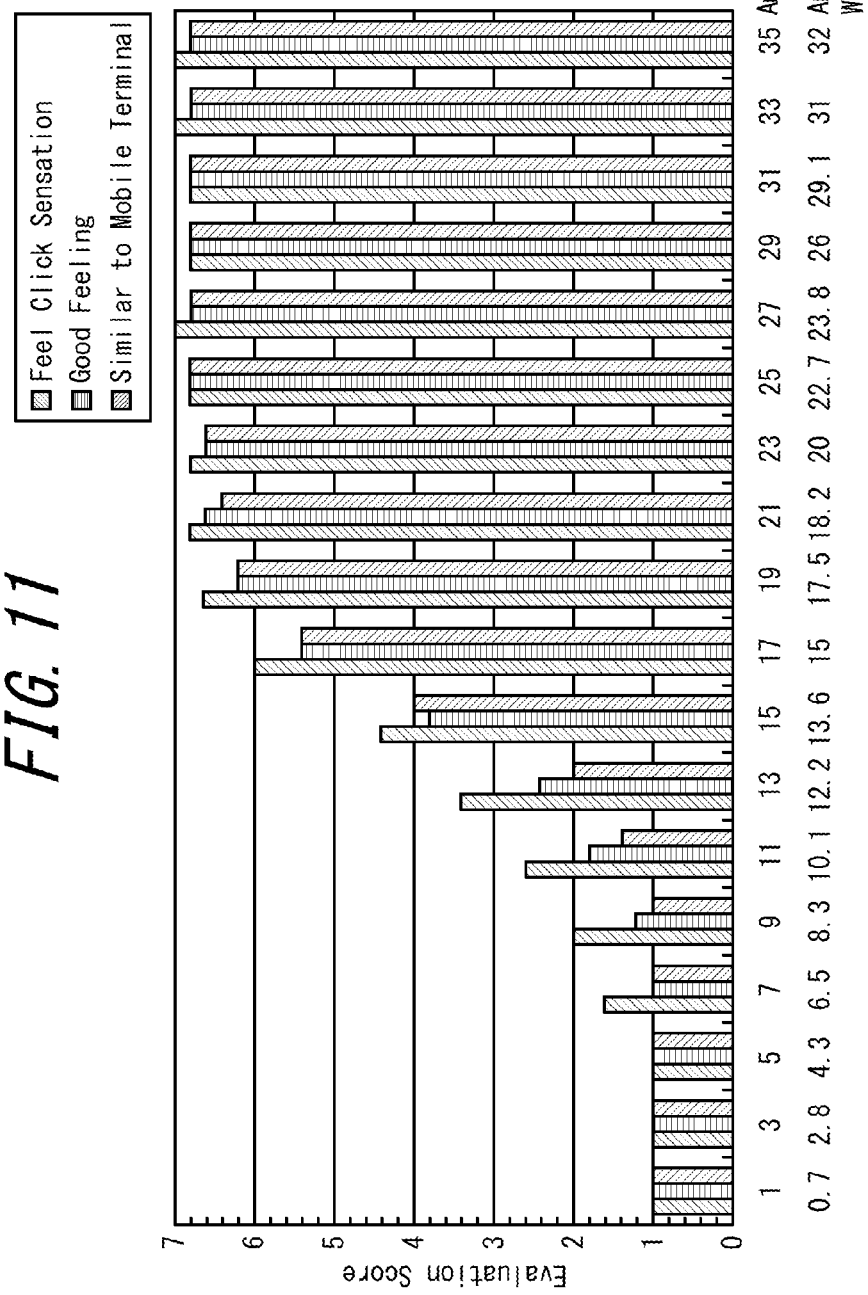
FIG. 11 is a diagram illustrating results of sensory evaluations on the click sensation when varying vibration amplitude of the touch sensor.

FIG. 11 shows results of evaluations when varying the amplitude of the drive signal. In the sensory evaluations, the frequency of the drive signal for driving the vibration unit was 170 Hz, the period was 1 period and the waveform was the sine wave. The signal amplitude was varied such that, in a state with no load in which the touch sensor was not pressed, the touch sensor is vibrated in predetermined amplitude in a range of 1-35 μm. Under a condition of the vibration amplitude with no load, the vibration unit was driven when a load of 1.5 N is applied on to the touch sensor in order to evaluate each item. A horizontal axis in FIG. 11 represents the vibration amplitude when the load of 1.5 N was applied corresponding to the vibration amplitude with no load on the touch sensor. As a result, as can be seen in FIG. 11, it was confirmed that, in a state with the load of 1.5 N, the human can sufficiently obtain the click sensation if the vibration amplitude is 15 μm or more. That is, the human can feel the click sensation if the touch sensor is vibrated with the vibration amplitude of 15 μm or more for only 1 period at a frequency of 170 Hz in a state of the load of 1.5 N being applied on the touch sensor.

Figure 12:
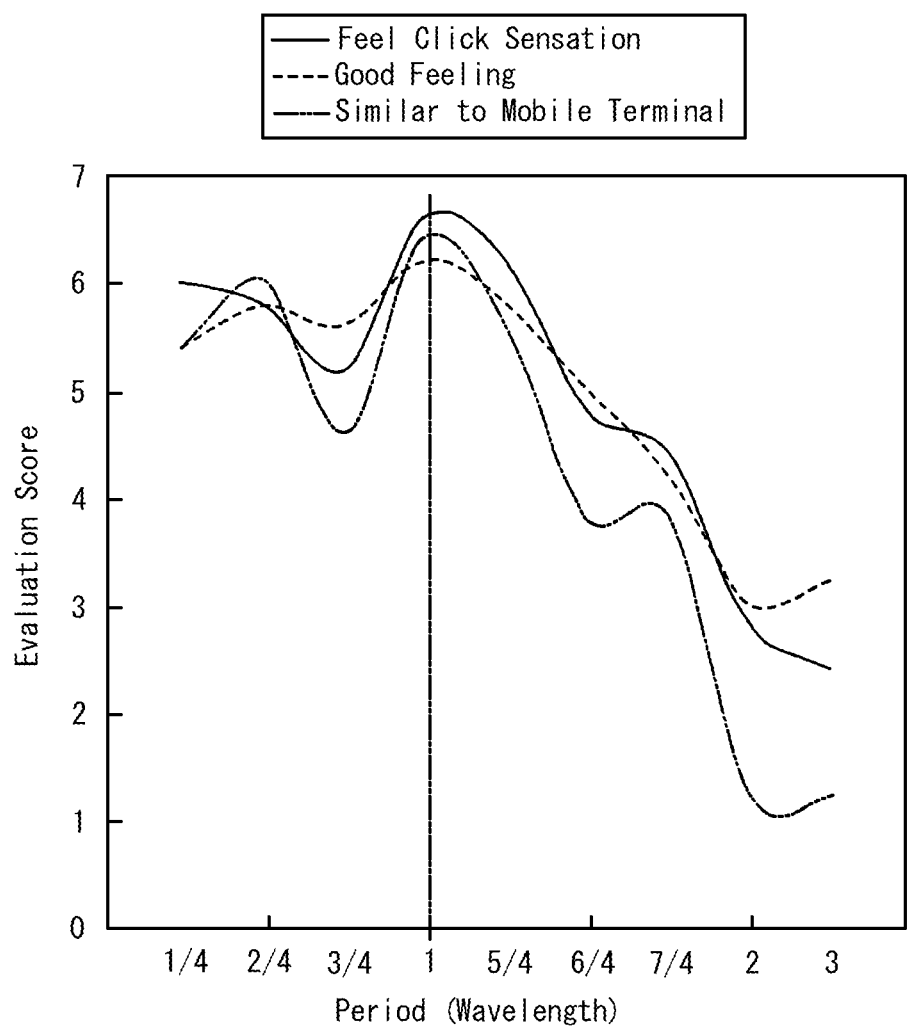
FIG. 12 is a diagram illustrating results of sensory evaluations on the click sensation when varying period of a drive signal for vibrating the touch sensor.

FIG. 12 shows results of evaluations when varying the period (wavelengths), that is, drive time. In the sensory evaluations, the waveform of the drive signal for driving the vibration unit was the sine wave, the signal amplitude was set to obtain the vibration amplitude of 15 μm in a state of the predetermined standard load being applied on the touch sensor, the frequency was 170 Hz and the period was varied in a range of 1/4 to 3 periods. For 1/4 period and 1/2 period, the signal amplitude was set such that a vibration displacement on the touch sensor was approximately the same as those in other periods, that is, so as to obtain the vibration amplitude of approximately 15 μm. As a result, as can be seen in FIG. 12, the highest evaluation was obtained when the period (wavelength) was 1 period. In addition, it was also confirmed that, good results were basically obtained with 5/4 periods and less than 1 period, but in case of 3/2 or more periods the tactile sensation differed from the click sensation of the mobile terminal.

Figure 13:
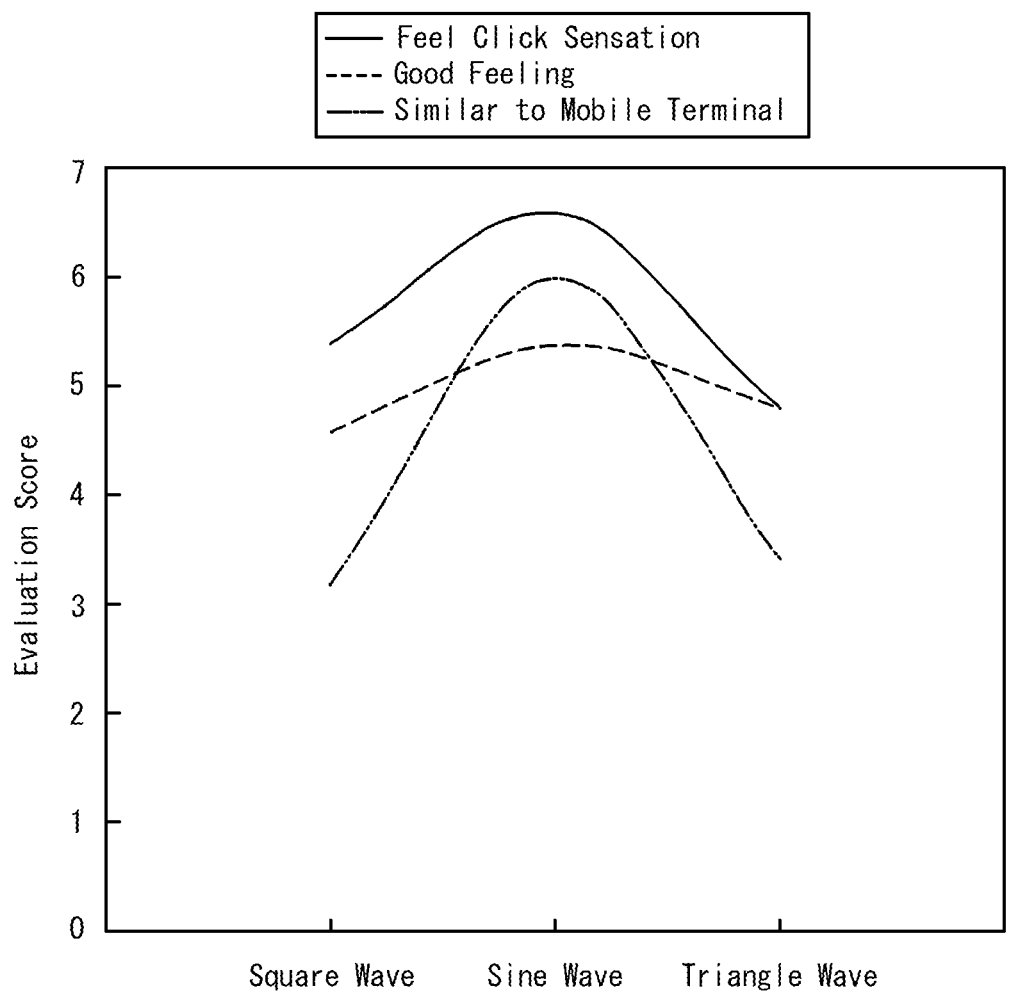
FIG. 13 is a diagram illustrating results of sensory evaluations on the click sensation when varying waveform of the drive signal for vibrating the touch sensor.

FIG. 13 shows results of evaluations when varying waveform of the drive signal. In the sensory evaluations, the sine wave, a square wave and a triangle wave were used as the waveform of the drive signal for driving the vibration unit. In addition, each signal has a frequency of 170 Hz, the signal amplitude was set to a level which causes the vibration amplitude of 15 μm in the state of the predetermined standard load being applied to the touch sensor, and the period was 1 period. As a result, as can be seen in FIG. 13, the highest evaluation was obtained by the sine wave.

Figure 14:
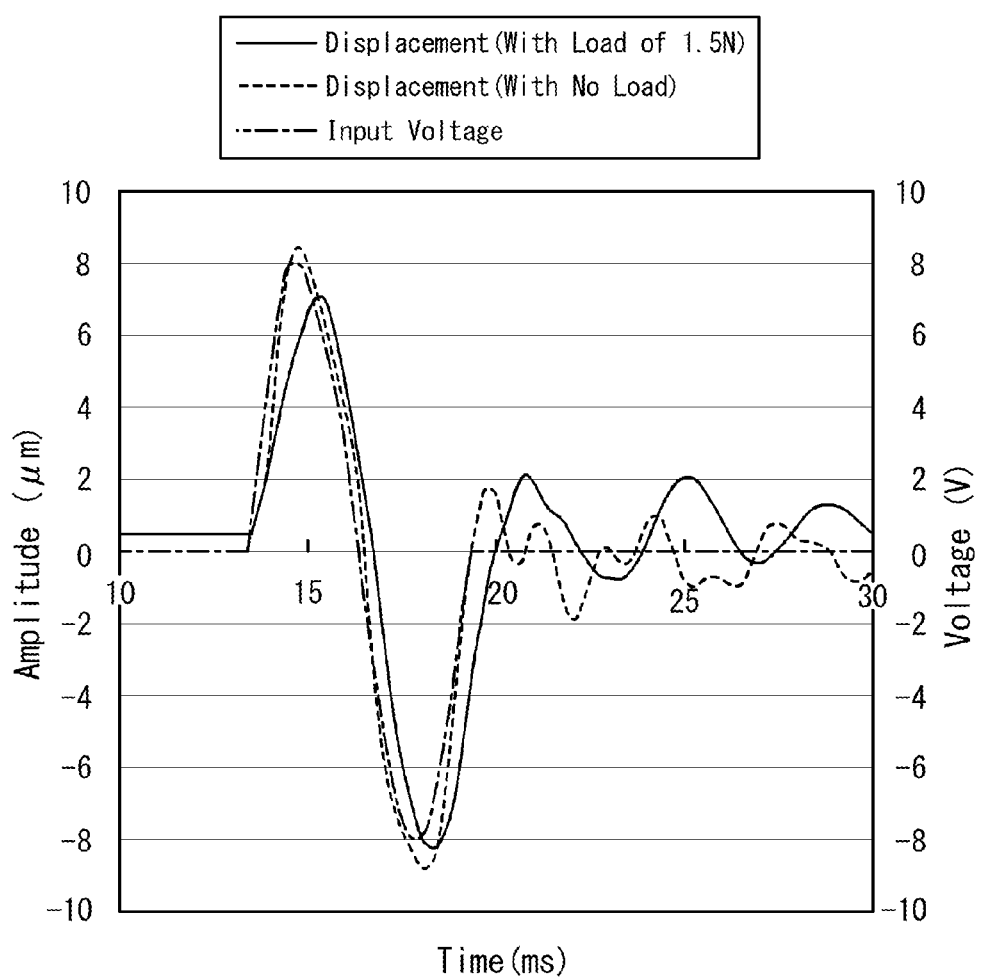
FIG. 14 is a diagram illustrating the waveform of the drive signal for vibrating the touch sensor and an actual waveform of the vibration amplitude of the touch sensor.

Here, the drive signal of the sine wave (input voltage of the drive unit), as shown by a dashed line in FIG. 14, may be the voltage in 1 period from any phase not only 1 period in which the voltage increases from 0 degree phase and then decreases but also, such as, 1 period in which the voltage decreases from 180 degree phase and then increases. FIG. 14 also shows a waveform (broken line) of the vibration amplitude of the touch sensor under no load and a waveform (solid line) of the vibration amplitude of the touch sensor under a load of 1.5 N when the drive unit is driven by the input voltage shown by the dashed line.

From the exemplary results of the evaluations described above, it was confirmed that it is possible to provide the realistic click sensation to the operator, at a point when a load satisfying the predetermined standard is applied on the touch sensor, if the vibration unit is vibrated with a drive signal of, for example, 5/4 period or less, preferably 1 period of the sine wave with a frequency of 140 Hz or more, preferably 170 Hz, and amplitude to vibrate the vibration unit by approximately 15 μm or more.

The input apparatus according to each embodiment of the present invention drives the load detection unit 12 (44) based on the results of the sensory evaluations described above. That is, if the load detection unit 12 (44) detects the pressure load of 1.5 N, which is the standard for providing the tactile sensation, the tactile sensation providing unit 13 (45) is driven with the drive signal of, for example, 5/4 or less period, preferably 1 period of the sine wave with a frequency of 140 Hz or higher, preferably 170 Hz, and the amplitude to vibrate the touch sensor 11 (41) by approximately 15 μm or more. Thereby, it is possible to provide the realistic click sensation to the operator.

(Third Embodiment)

When the human operates the push-button switch, the human is given a tactile stimulus at a finger by the push-button switch not only in pressing but also in releasing, as shown in FIG. 4. As such, an input apparatus according to a third embodiment of the present invention, using the input apparatus according to the first or the second embodiments, provides an operator with a click sensation in releasing as well (hereinafter, the click sensation in releasing is referred to as a release sensation, arbitrarily). Thereby, it provides the operator with a realistic click sensation more similar to that of the push-button switch. The following is a description of operations by the input apparatus according to the present embodiment, using the constitution shown in FIG. 5 and FIG. 6, by way of example.

Figure 15:
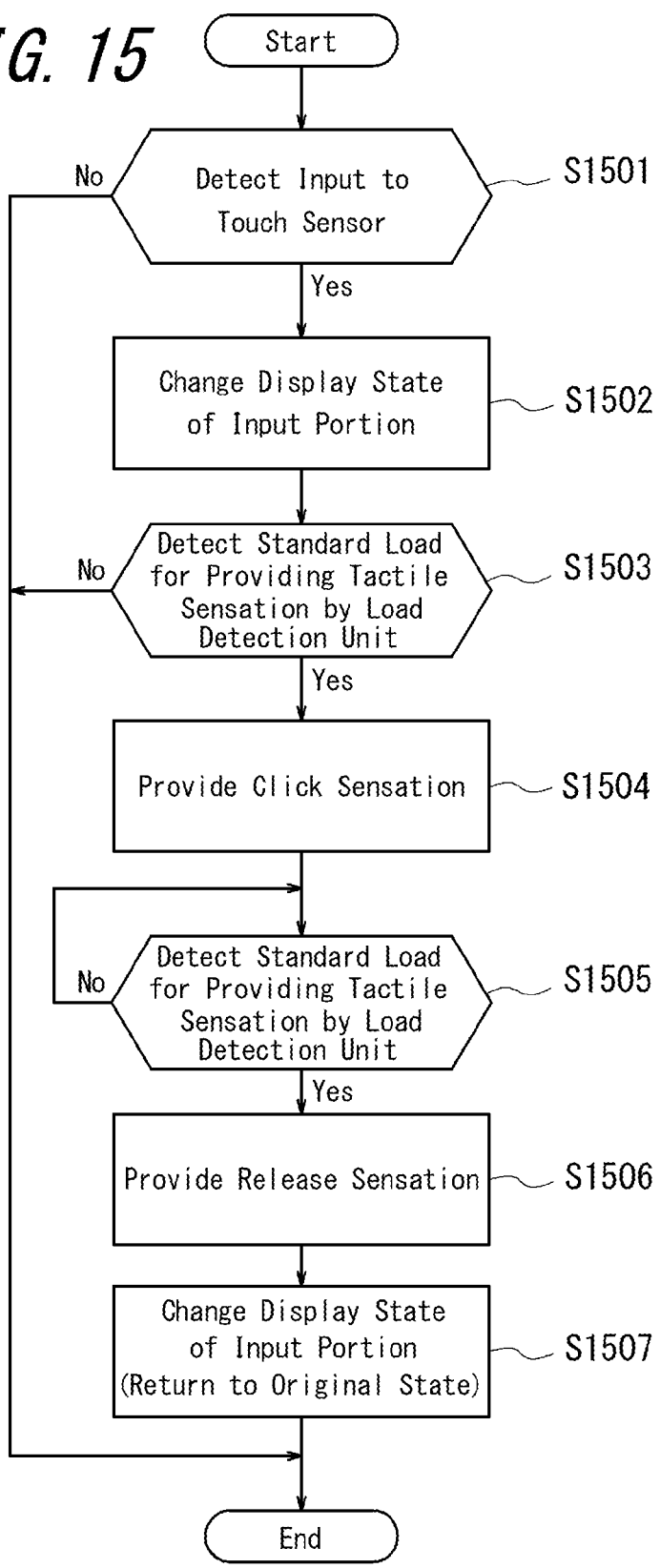
FIG. 15 is a flowchart of operations by an input apparatus according to a third embodiment of the present invention.

FIG. 15 shows a flowchart of operations by the input apparatus according to the present embodiment. In FIG. 15, steps S1501 to S1504 are processing the same as those at steps S701 to S704 shown in FIG. 7. That is, as described with reference to FIG. 7, when detecting that the input to the touch sensor 11 is the input to the input object displayed on the display unit 14 (step S1501), the control unit 15 changes the display state of the portion (input portion) on the display unit 14 contacted by the pressing object (pressing means) by changing color and the like (step S1502).

In addition, when detecting that the pressure load detected by the load detection unit 12 increases with the pressure on the touch sensor 11 and satisfies the standard for providing the tactile sensation (step S1503), the control unit 15 drives the tactile sensation providing unit 13 with a predetermined drive signal. Thereby, the touch sensor 11 is vibrated in a predetermined vibration pattern (step S1504) in order to provide the click sensation to the operator via the pressing object (pressing means) pressing the touch sensor 11. Here, in the same manner as the above embodiments, the standard pressure load for providing the click sensation is set to a pressure load at which the touch sensor 11 responds, that is, detects the input, or higher.

Then, in resealing, when detecting that the load detected by the load detection unit 12 satisfies the standard for providing the tactile sensation (step S1505), the control unit 15, in the same manner as that in pressing, drives the tactile sensation providing unit 13 with a predetermined drive signal. Thereby, the touch sensor 11 is vibrated in a predetermined vibration pattern (step S1506) in order to provide the release sensation to the operator via the pressing object (pressing means) pressing the touch sensor 11. In addition, substantially at the same time to drive the tactile sensation providing unit 13, the control unit 15 changes the display state of the portion (input portion) in the display unit 14 touched by the pressing object (pressing means) by returning to an original state and the like (step S1507). Thereby, it allows the operator to recognize that the input operation is completed.

Here, a standard load (second standard) for providing the tactile sensation in releasing at step S1505, that is, a standard load used for detection after the click sensation is provided in pressing may be set to any load lower than a standard load of pressing (first standard) for providing the click sensation used for detection at step S1503. In addition, in releasing at step S1506, the drive signal for driving the tactile sensation providing unit 13 may be either the same as or different from that in pressing at step S1504. For example, the frequency of the drive signal in pressing when the touch sensor 11 detects the input may be at 170 Hz, while that in releasing may be at 125 Hz as shown in FIG. 4.

As stated above, it is possible to provide the release sensation corresponding to the click sensation, when the load detected by the load detection unit 12 satisfies the standard for providing the tactile sensation in releasing after the click sensation is provided in pressing, by driving the tactile sensation providing unit 13 with the predetermined drive signal to vibrate the touch sensor 11 in the predetermined vibration pattern in the same manner as that in pressing. Accordingly, in combination with the click sensation in pressing, it is possible to provide the click sensation more similar to that of the push-button switch to the operator.

Figure 16:
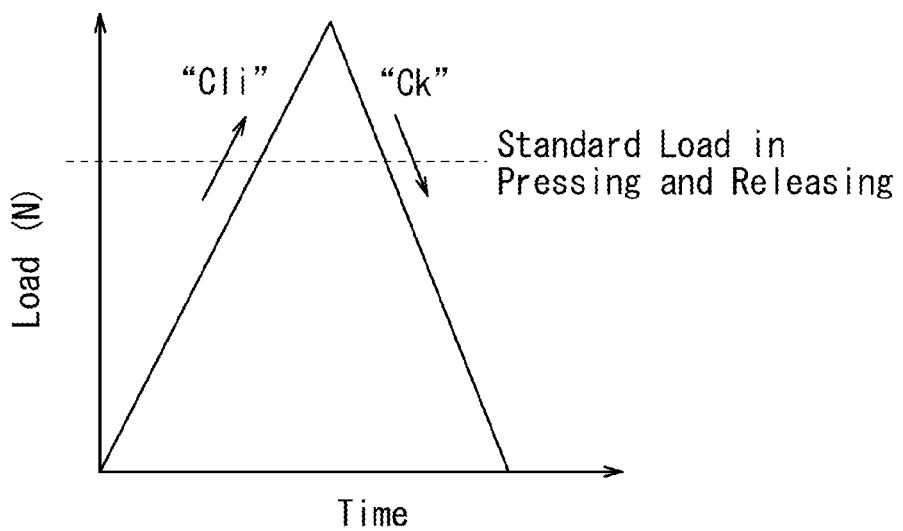
FIG. 16 is a diagram illustrating an example of click sensation provided by the input apparatus according to the third embodiment when a standard load of pressing for providing the tactile sensation and that of releasing for providing the tactile sensation are set to be equal.

For example, if the standard load of pressing for driving the tactile sensation presenting unit 13 and that of releasing are set to be equal, it is possible to provide the click sensation and the release sensation in pressing and releasing, respectively, as shown in FIG. 16 if a maximum load in pressing exceeds the standard load. Accordingly, it is possible to provide the click sensation more similar to that of the push-button switch to the operator. It is to be noted that, in FIG. 16 and other figures, "Cli" and "Ck" represent the click sensation the human feels.

Figure 17:
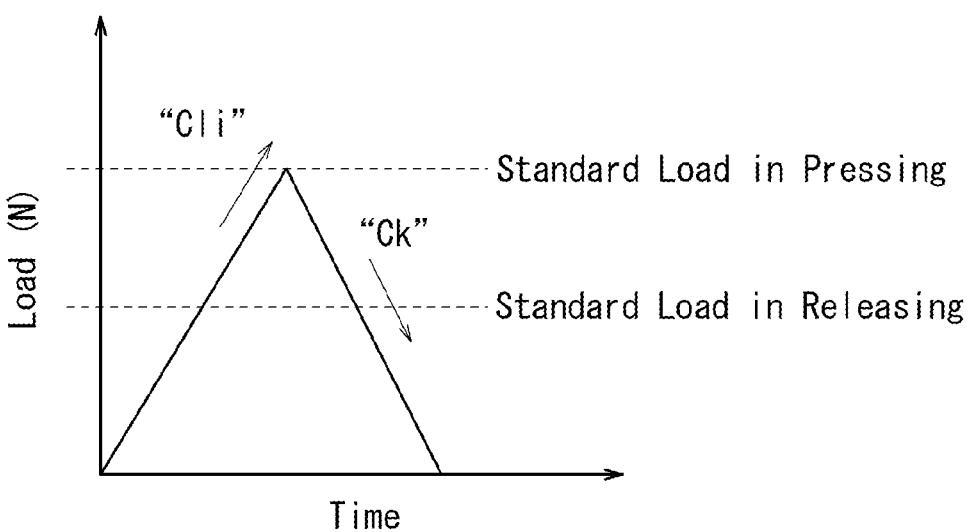
FIG. 17 is a diagram illustrating an example of click sensation provided by the input apparatus according to the third embodiment when the standard load of releasing for providing the tactile sensation is set to be less than that of pressing for providing the tactile sensation.

In a case where the standard load of releasing for driving the tactile sensation providing unit 13 is set to any load lower than that of pressing, even if the maximum load in pressing is the standard load of pressing, that is, even if the pressing object (pressing means) is pulled back at the standard load of pressing, it is possible to provide the click sensation and the release sensation corresponding to the click sensation in pressing and releasing, respectively, as shown in FIG. 17. As shown in FIG. 16, in a case where the standard load of pressing for driving the tactile sensation providing unit 13 and that of releasing are set to be equal, if the maximum load in pressing is the standard load, the tactile sensation providing unit 13 may not be driven in releasing or providing an unexpected release sensation when the operator intends to maintain the pressure load at the standard load, resulting in the feeling of strangeness to the operator. In contrast, if the standard load of releasing (second standard) for driving the tactile sensation providing unit 13 is set to any load lower than that of pressing (first standard) as shown in FIG. 17, it ensures to provide the release sensation in releasing and thus it is possible to ensure to provide the click sensation more similar to that of the push-button switch to the operator.

Figure 18:
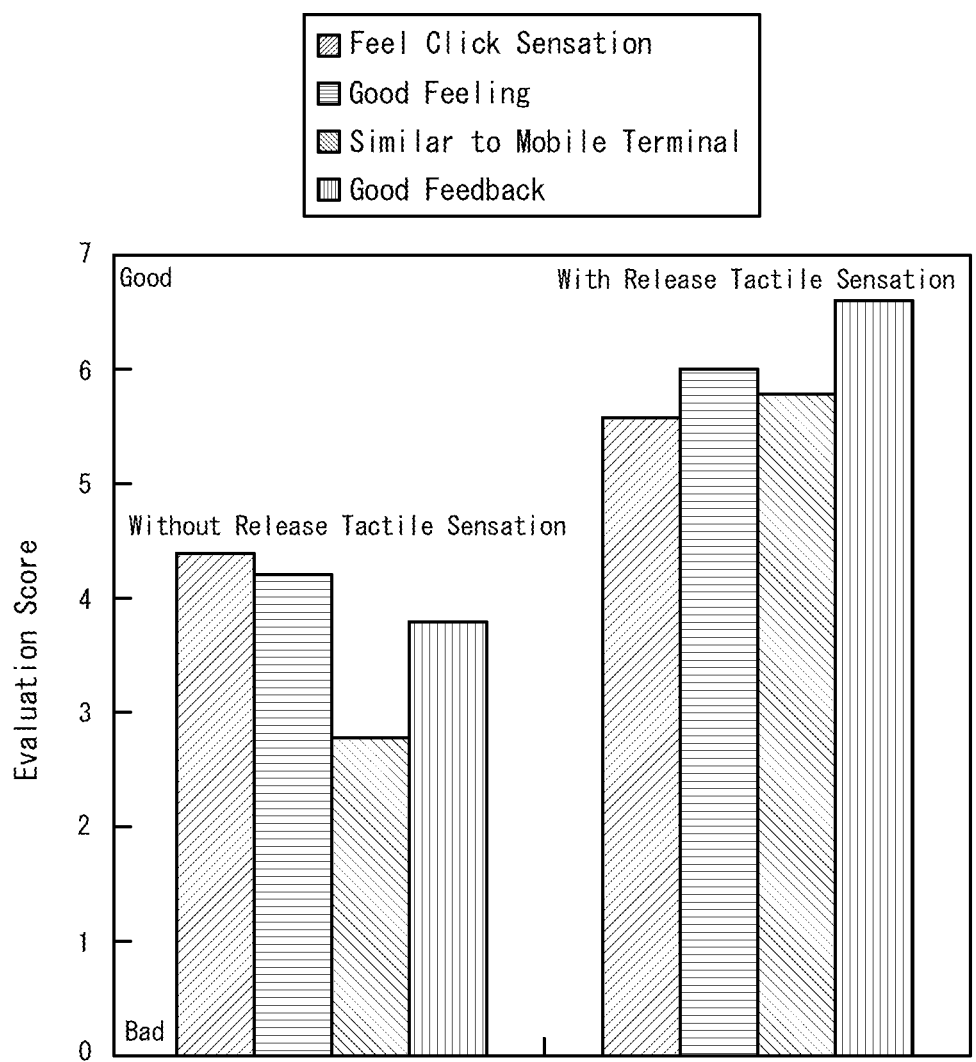
FIG. 18 is a diagram illustrating exemplary results of sensory evaluations on the click sensation comparing with and without the click sensation.

FIG. 18 shows results of sensory evaluations when only the click sensation was provided in pressing and when the click sensation was provided in pressing and the release sensation was provided in releasing. In the same manner as the sensory evaluations described above, these sensory evaluations were conducted using the input apparatus previously suggested by the applicant.

In FIG. 18, bars on the left side represent results of the evaluations when only the click sensation was provided in pressing, that is, "without the release sensation", whereas bars on the right side represent results of the evaluations when the click sensation was provided in pressing and the release sensation was provided in releasing, that is, "with the release sensation". The subjects were the same five people as those involved in the sensory evaluations shown in FIG. 2 and FIG. 3. Evaluation items were four items including "good feedback (easy to percept)" in addition to the three evaluation items in FIG. 10 to FIG. 13. Each item is on a scale of 1 to 7 and the score of each item represents an average score of the five people. For the item "good feedback", "bad" scores 1 and "good" scores 7. In addition, the standard load of pressing and that of releasing to provide the tactile sensation were set to be equal and the same drive signal is used in pressing and releasing. Here, the standard load for providing the tactile sensation was 1.5 N. In addition, the drive signal was 1 period of sine wave with the frequency of 170 Hz and the amplitude to vibrate the touch sensor by approximately 15 pm under the pressure of 1.5 N.

As can be seen in the results of the evaluations in FIG. 18, it was confirmed that, if the release sensation is provided by vibrating the touch sensor in releasing as well, the click sensation becomes more similar to that of the push-button switch of the mobile terminal and a good feedback (perception) can be obtained.

(Fourth Embodiment)

Incidentally, the input apparatus used in the mobile terminals, for example, is often used for a so-called repetitive tap to continuously input the same input object in inputting a phone number, a message and the like. In such a case, if the touch sensor 11 is vibrated in the predetermined vibration pattern not only in pressing but also in releasing as shown in FIG. 18, it is necessary to appropriately set the predetermined standard load of releasing for providing the tactile sensation.

Figure 19:
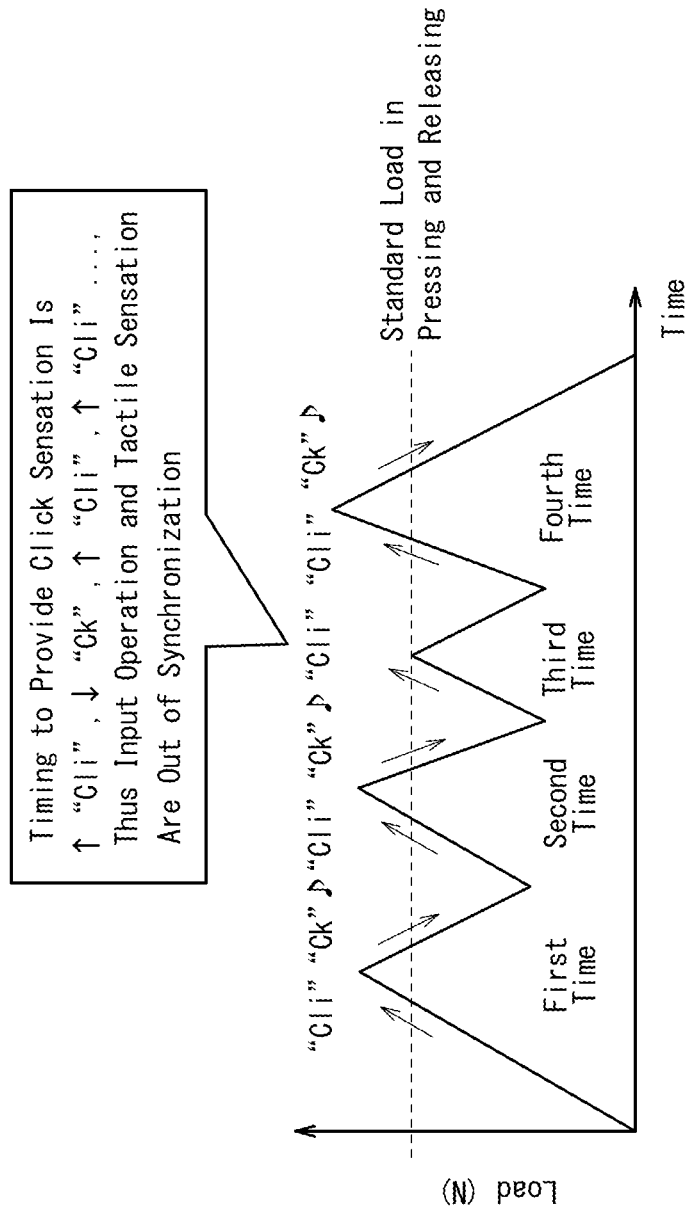
FIG. 19 is a diagram illustrating example of tactile sensations provided during continuous input when the standard load of pressing for providing the tactile sensation and that of releasing for providing the tactile sensation are set to be equal.

That is, when the human quickly performs continuous input, a next input is generally started before the pressure load returns to "0" and the maximum load in pressing varies. At this point, in a case where the standard load of pressing for providing the tactile sensation and that of releasing are set to be equal as described in the third embodiment, if the pressure load is pulled back at the standard load during continuous input as shown in FIG. 19, the tactile sensation providing unit 13 may not be driven in releasing of the input or the click sensation of a next input may be provided before the operator recognizes to have released. Accordingly, the tactile sensation are not matched with the input operation, thereby inflicting the feeling of strangeness on the operator. FIG. 19 shows a case where a pressure load on a third input in four continuous inputs is pulled back from the standard load.

Figure 20:
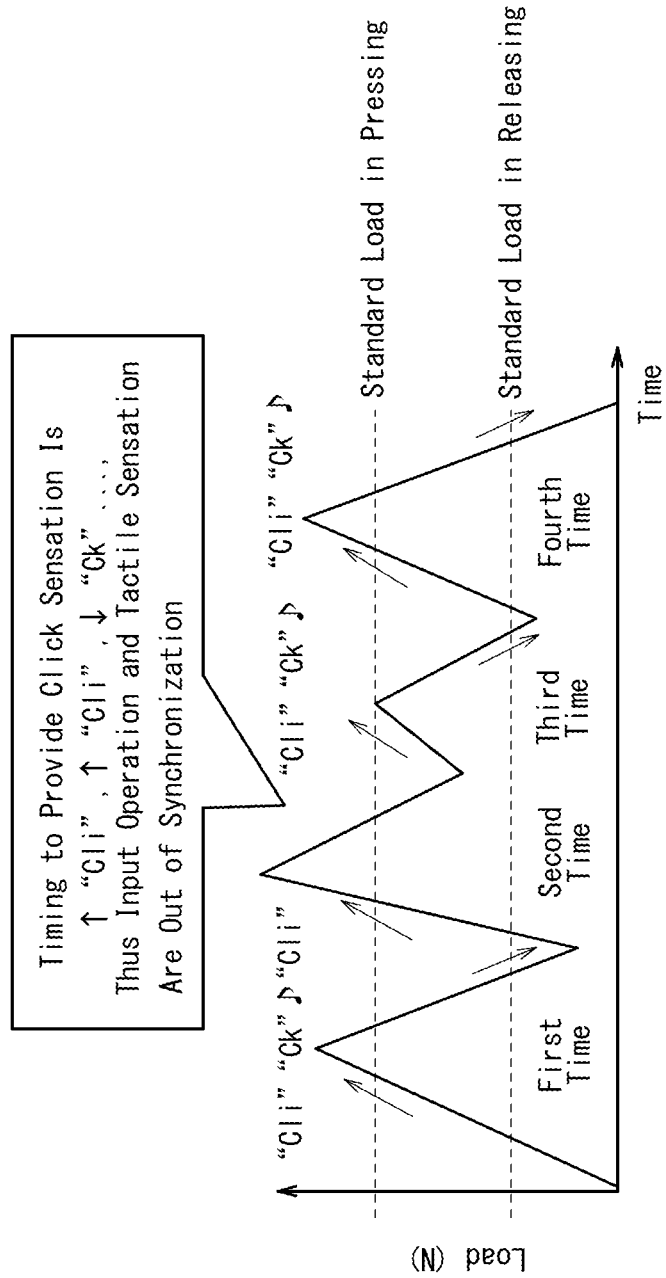
FIG. 20 is a diagram illustrating example of tactile sensations provided during continuous input when the standard load of releasing for providing the tactile sensation is set lower than that of providing for presenting the tactile sensation.

On the other hand, if the standard load of releasing for providing the tactile sensation is set too low in comparison with that of pressing for providing the tactile sensation, it may inflict the feeling of strangeness on the operator when a next input operation is performed before the load returns to the standard load of releasing during continuous input as shown in FIG. 20, as it provides the tactile sensation out of synchronization. FIG. 20 shows a case where a third input in four continuous inputs is operated before a load of releasing on a second input reaches the standard load of releasing. In addition, if the standard load of releasing for providing the tactile sensation is too low as stated above, it takes time to return thereto. As a result, it takes time to allow a next input even when the operator desires to perform input continuously without feeling of strangeness by the sensation provided. Accordingly, it prevents the operator from operating quick continuous input, and thus there is a concern that it may deteriorate operability during continuous input (repetitive tap).

Figure 21:
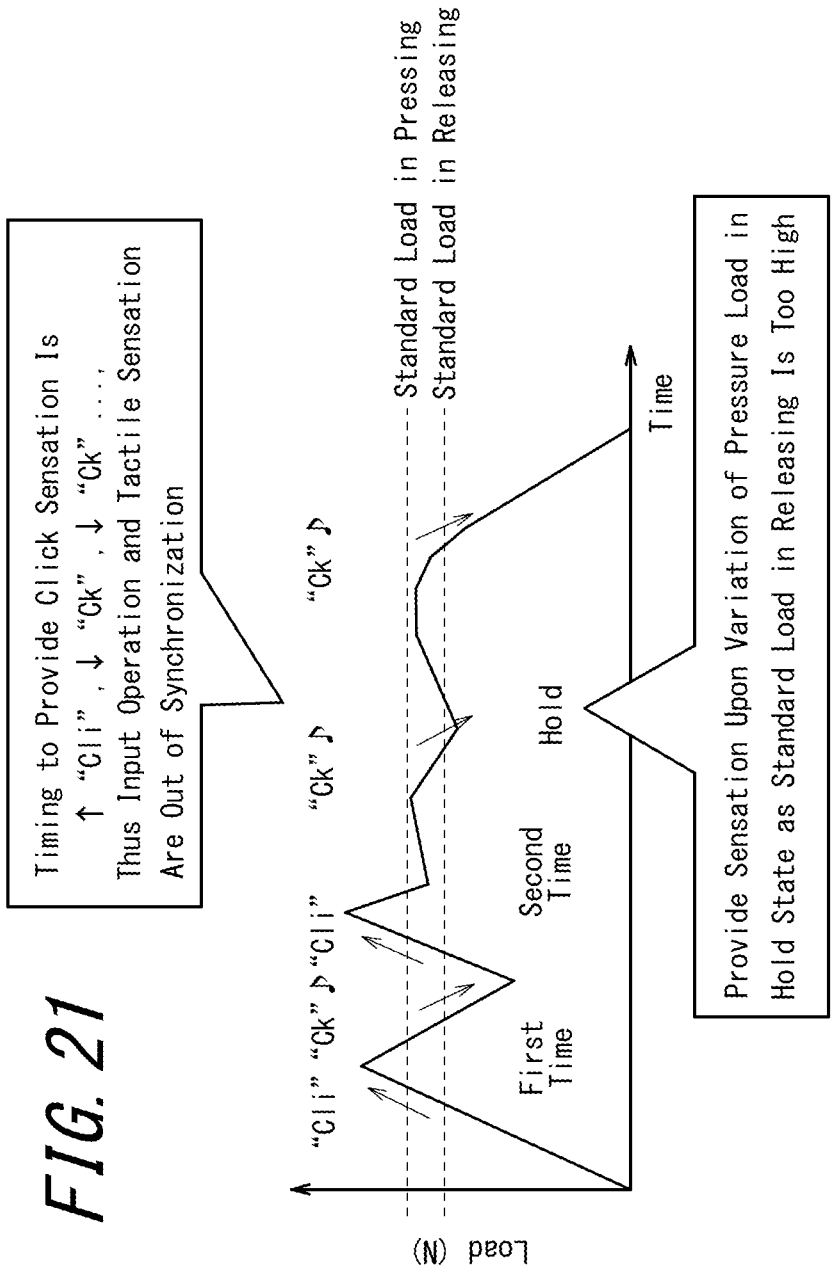
FIG. 21 is a diagram illustrating example of tactile sensations provided during continuous input when the standard load of releasing for providing the tactile sensation is set close to that of pressing for providing the tactile sensation.

In contrast, if the standard load of releasing for providing the tactile sensation is set close to the that of pressing for providing the tactile sensation, it enables quicker continuous input. However, if the operator tries to maintain a pressed state (hold) during continuous input, an unexpected release sensation may be provided to the operator inflicting the feeling of strangeness. That is, when the pressed state is held during continuous input, the load slightly varies even though the operator intends to maintain the pressure load constant. Therefore, as shown in FIG. 21, for example, if a load range between the standard load of pressing and that of releasing is smaller than a load variation range in a holding state as described above, the operator is provided with the release sensation despite thinking oneself holding and thus has the feeling of strangeness.

As such, according to the fourth embodiment of the present invention, in order to deal with the operability problem during continuous input described above and slight variation in the load in the holding state and to allow the operator to perform continuous input smoothly with feeling the realistic click sensation and the release sensation, the standard load of releasing for providing the tactile sensation is set to a value in a range of approximately 50-80% of that of pressing for providing the tactile sensation, using the input apparatus described in the third embodiment.

Figure 22:
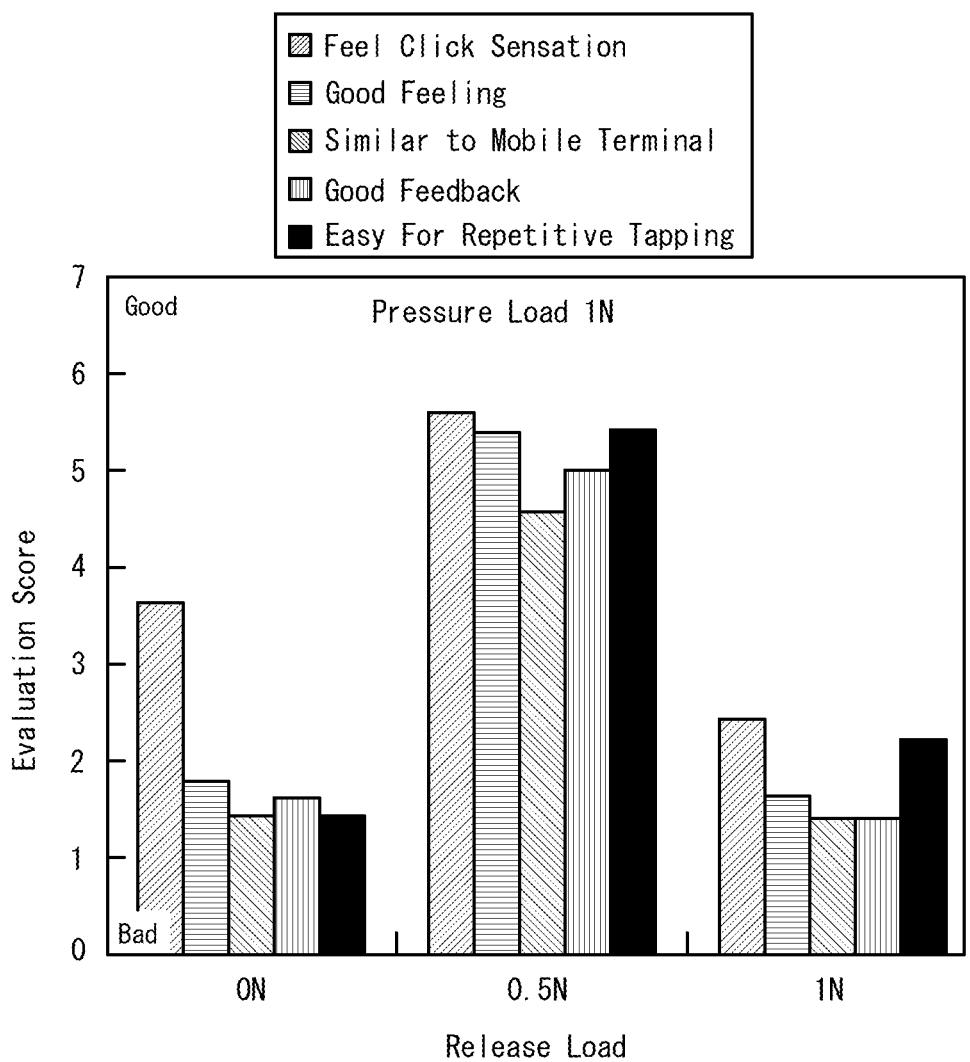
FIG. 22 is a diagram illustrating exemplary results of sensory evaluations on tactile sensations during continuous input when the standard load of pressing for providing the tactile sensation is set to 1N.
Figure 23:
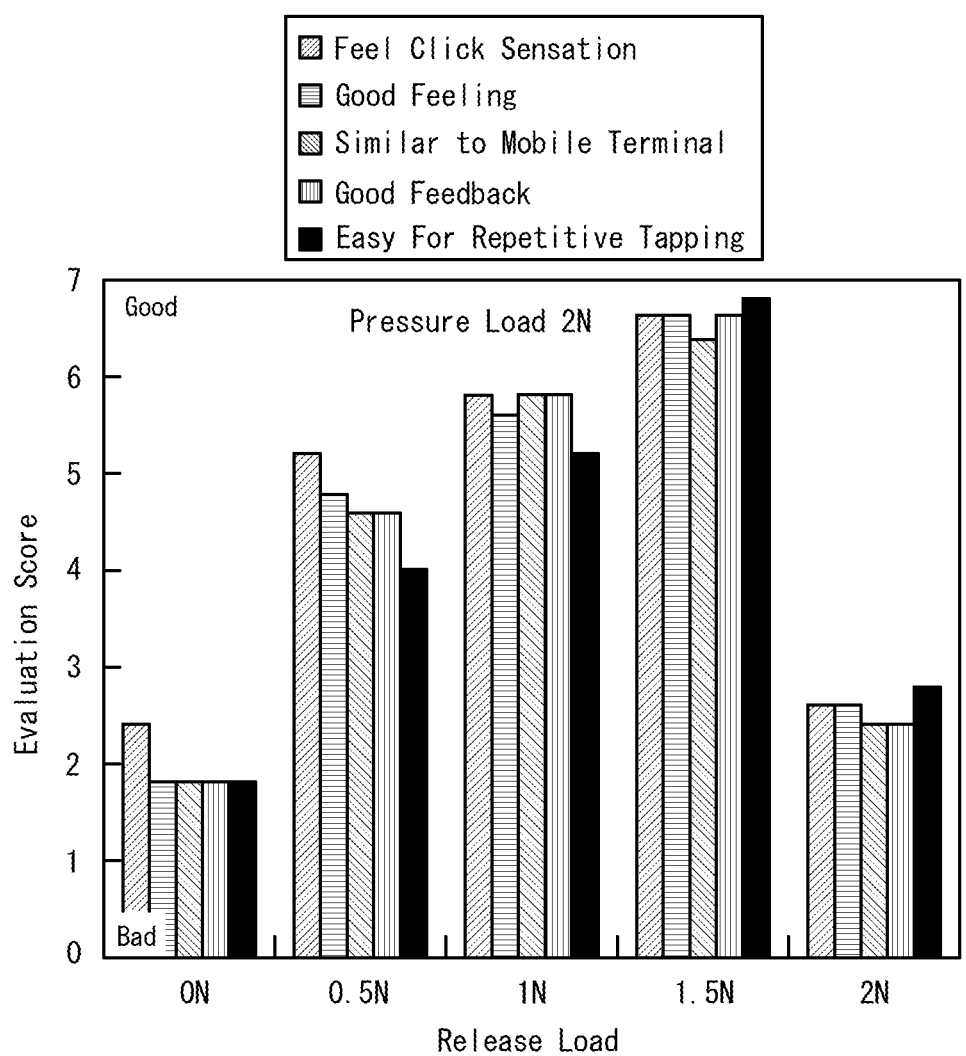
FIG. 23 is a diagram illustrating exemplary results of sensory evaluations on tactile sensations during continuous input when the standard load of pressing for providing the tactile sensation is set to 2N.
Figure 24:
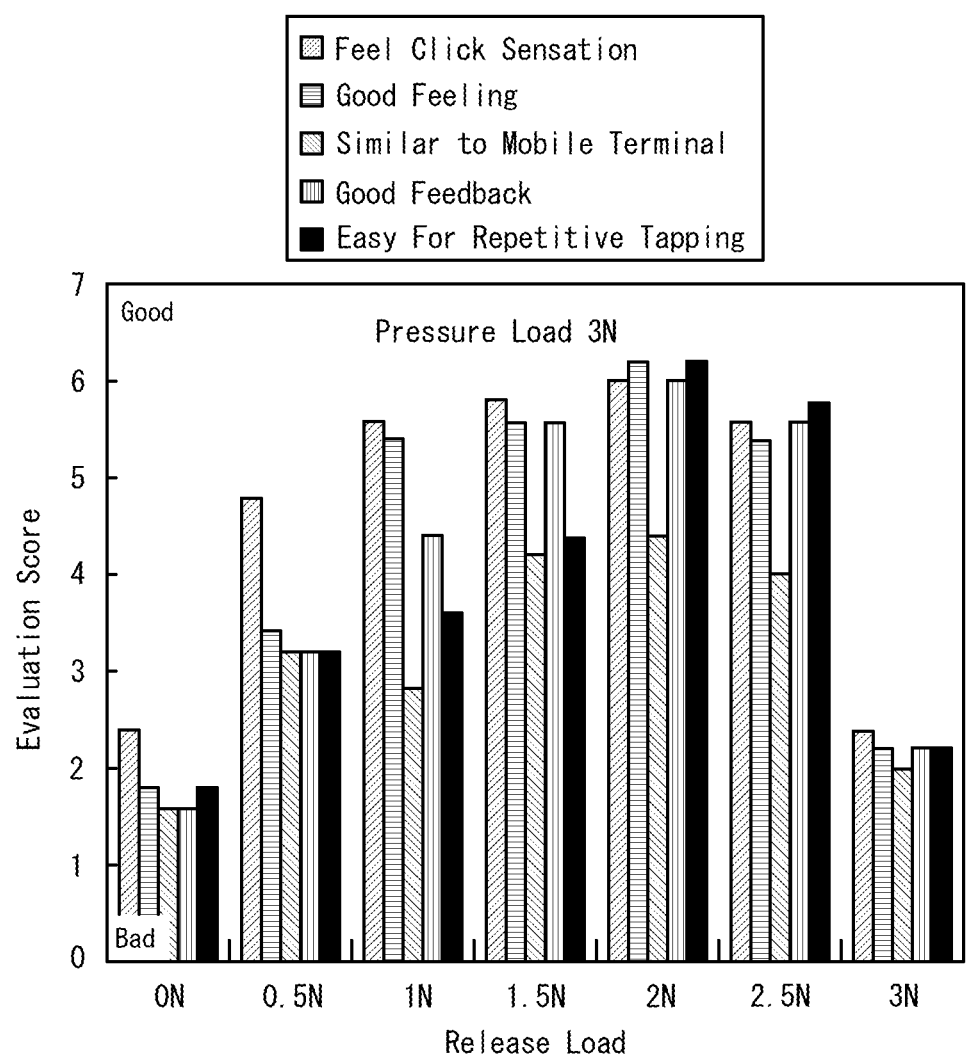
FIG. 24 is a diagram illustrating exemplary results of sensory evaluations on tactile sensations during continuous input when the standard load of pressing for providing the tactile sensation is set to 3N.

FIG. 22 to FIG. 24 are diagrams illustrating the results of sensory evaluations on the click sensation during continuous input (repetitive tapping). In the same manner as the results of the sensory evaluations described above, these sensory evaluations were conducted using the input apparatus previously suggested by the applicant.

In FIG. 22 to FIG. 24, the subjects were the same five people involved in the sensory evaluations shown in FIG. 18. Evaluation items were five items including "easy for repetitive tap" in addition to the four items in FIG. 18. Each item is on a scale of 1 to 7 and the score of each item represents an average score of the five people. For the item "easy for repetitive tap", "No" scores 1 and "Yes" scores 7. In addition, both in pressing and in releasing, the drive signal to drive the vibration unit (corresponding to the tactile sensation providing unit according to the present invention) was 1 period of the sine wave with the frequency of 170 Hz and the amplitude for vibrating the touch sensor by approximately 15 μm when the standard load for providing the tactile sensation was satisfied.

FIG. 22 shows results of evaluations when the standard load of pressing for providing the tactile sensation was 1 N and the standard load of releasing for providing the tactile sensation was 0 N, 0.5 N and 1 N. As can be seen in FIG. 22, if the standard load of pressing for providing the tactile sensation was 1 N, the highest evaluations for all items were obtained when the standard load of releasing for providing the tactile sensation was 0.5 N.

FIG. 23 shows results of evaluations when the standard load of pressing for providing the tactile sensation was 2 N and the standard load of releasing for providing the tactile sensation was 0 N, 0.5 N, 1 N, 1.5 N and 2 N. As can be seen in FIG. 23, if the standard load of pressing for providing the tactile sensation was 2 N, high evaluations were obtained when the standard load of releasing for providing the tactile sensation was 1 N and 1.5 N. The highest evaluations for all items were obtained especially with 1.5 N.

FIG. 24 shows results of evaluations when the standard load of pressing for providing the tactile sensation was 3 N and the standard load of releasing for providing the tactile sensation was 0 N, 0.5 N, 1 N, 1.5 N, 2 N, 2.5 N and 3 N. As can be seen in FIG. 24, if the standard load of pressing for providing the tactile sensation was 3 N, high evaluations were obtained when the standard load of releasing for providing the tactile sensation was 1.5 N, 2 N and 2.5 N. The highest evaluations for all items were obtained especially with 2 N.

From the exemplary results of the evaluations described above, it was confirmed that, if the standard load of releasing for providing the tactile sensation is set to a value in the range of approximately 50-80% of that of pressing for providing the tactile sensation, it is possible to synchronize sequential inputs and timings to provide the tactile sensation during continuous input (repetitive tapping), and thus the realistic click sensation can be provided without giving the feeling of strangeness. That is, it is prevented from inflicting the feeling of strangeness by setting the standard load of releasing for providing the tactile sensation smaller than that of pressing for providing the tactile sensation, and it is possible to significantly improve the operability during continuous input by setting the standard load of releasing for providing the release sensation approximately 50% or more of the standard load of pressing for providing the release sensation. In addition, it is also possible to deal with slight variations in the load in the holding state during continuous input by setting the standard load of releasing for providing the tactile sensation approximately equal to or less than 80% of that of pressing for providing the tactile sensation.

Accordingly, in the fourth embodiment of the present invention as well, in consideration of the above results of the sensory evaluations, if the standard load of pressing for providing the tactile sensation is set 1 N, for example, the standard load of releasing for providing the tactile sensation is set to any value from 0.5 N to 0.8 N. In addition, if the standard load of pressing for providing the tactile sensation is high, the load variation range in the holding state is wider than that when that the standard load is low. In such a case also, the standard load of releasing for providing the tactile sensation is set in the range of approximately 50-80% of that of pressing for providing the tactile sensation. For example, if the standard load of pressing for providing the tactile sensation is set to 6 N, which is a high value, the standard load of releasing for providing the tactile sensation is set to 3 N-4.8 N. Thereby, it is possible to provide the realistic click sensation in synchronization with continuous input without providing unexpected release sensation which causes the feeling of strangeness. The standard load of pressing for providing the tactile sensation and the standard load of releasing for providing the tactile sensation may be set either fixedly or arbitrarily selectably by the user.

It is to be understood that the present invention is not limited to the embodiments set forth above and various modifications and changes may be implemented. For example, the load detection unit may be constituted of any number of strain gauge sensors. In addition, the load detection unit can be constituted without using the strain gage sensor if capable of detecting a load in accordance with an input detection type of the touch sensor, that is, detecting a load from a change of the output signal based on a resistance change according to a contact area in using the resistive film type or based on a change in capacitance in using the capacitive type. In addition, the tactile sensation providing unit may be constituted of any number of piezoelectric vibrators, transparent piezoelectric elements provided on an entire surface of the touch sensor, or an eccentric motor which rotates 360 degrees in 1 period of the drive signal. Moreover, the load detection unit and the tactile sensation providing unit can share the piezoelectric elements if both units are constituted of the piezoelectric elements.

In addition, the control unit may be configured to change the drive signal to drive the tactile sensation providing unit based on an input position detected by the touch sensor in order to change the click sensation.

The present invention is effectively applicable to an input apparatus in which the touch sensor serves as a touch switch for on/off operation. Also, the input apparatus according to the present invention is capable of providing feelings of a multistep switch, such as a two-step switch (pressed further after pressed), by sequentially providing the click sensation on different standards (loads) while the touch sensor is being pressed. Thereby, if the input apparatus is applied to a release button of a camera, for example, it can provide a feeling of lock focus (first step) and a feeling of release (second step). In addition, in combination with the display unit, the input apparatus can change a display of a menu screen and the like in a variety of manners in accordance with the steps of pressing. Moreover, when providing the feelings of the multistep switch, it is possible to change the drive signal to vibrate the touch face by the tactile sensation providing unit at each step in order to provide a different click sensation at each step.

According to the present invention, the vibration unit is driven when the load detected by the load detection unit satisfies a standard for providing the tactile sensation. Here, "when the load detected by the load detection unit satisfies the standard for providing the tactile sensation" may represent either "when the pressure load detected by the load detection unit reaches the standard load for providing the tactile sensation", "when the pressure load detected by the load detection unit exceeds the standard load for providing the tactile sensation", or "when the standard load for providing the tactile sensation is detected by the load detection unit".

The control unit vibrates the touch sensor in a predetermined vibration pattern by driving the tactile sensation providing unit when the pressure load detected by the load detection unit satisfies the standard for providing the tactile sensation, and such predetermined vibration pattern in pressing may be one as shown by the solid line in FIG. 4, whereas that in releasing may be another as shown by the dashed line in FIG. 4. Vibration of the touch sensor in those manners can provide the click sensation (vibration stimulus), similar to that obtained when operating the push-button switch, to the operator.

Reference Signs List 11 touch sensor
11a touch face
12 load detection unit
13 tactile sensation providing unit
14 display unit
15 control unit
21 housing
22 insulator
23 upper cover
24 insulator
31 strain gauge sensor
32 piezoelectric vibrator
41 touch sensor
41a input object
43 display unit
44 load detection unit
45 tactile sensation providing unit
46 control unit

The invention claimed is:

1. An apparatus comprising:
a touch sensor;
a tactile sensation providing unit for vibrating a touch face; and
a control unit for controlling drive of the tactile sensation providing unit to vibrate the touch face at a frequency such that a click sensation is provided to an object pressing the touch face,
wherein the tactile sensation providing unit is configured of piezoelectric.

2. A control method of an apparatus comprising a touch sensor and a tactile sensation providing unit for vibrating a touch face, the control method comprising the step of:
controlling drive of the tactile sensation providing unit to vibrate the touch face at a frequency such that a click sensation is provided to an object pressing the touch face, wherein
the tactile sensation providing unit is configured of piezoelectric.

* * * * *